(12) United States Patent
Du et al.

(10) Patent No.: US 12,238,956 B2
(45) Date of Patent: Feb. 25, 2025

(54) DISPLAY SUBSTRATE, METHOD FOR MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Hongjun Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/619,338

(22) Filed: Mar. 28, 2024

(65) Prior Publication Data

US 2024/0244877 A1    Jul. 18, 2024

Related U.S. Application Data

(63) Continuation of application No. 17/432,371, filed as application No. PCT/CN2020/118883 on Sep. 29, 2020, now Pat. No. 11,974,451.

(51) Int. Cl.
*H10K 50/842*   (2023.01)
*H10K 59/131*   (2023.01)
(Continued)

(52) U.S. Cl.
CPC ....... *H10K 50/8426* (2023.02); *H10K 59/131* (2023.02); *H10K 71/00* (2023.02); *H01L 25/18* (2013.01); *H10K 59/1201* (2023.02)

(58) Field of Classification Search
None
See application file for complete search history.

(56) References Cited

U.S. PATENT DOCUMENTS

2005/0184927 A1* 8/2005 Kwak ................. H10K 59/131
                                                         345/45
2012/0106098 A1* 5/2012 Kwon ................. H10K 59/131
                                                         29/850
(Continued)

FOREIGN PATENT DOCUMENTS

CN    201893383 U    7/2011
CN    105374849 A    3/2016
(Continued)

OTHER PUBLICATIONS

Notice of Allowance for copending U.S. Appl. No. 17/432,371, dated Jan. 4, 2024, 8 Pages.
(Continued)

*Primary Examiner* — Cory W Eskridge
(74) *Attorney, Agent, or Firm* — BROOKS KUSHMAN P.C.

(57) ABSTRACT

A display substrate, a method for manufacturing the same and a display device. In the display substrate, a sealant region includes: a corner sealant region, a lead-in sealant region, and a first sealant region on a first side of a display area. The corner sealant region is provided with an encapsulation base layer. A non-display area is provided with a second power line, a gate drive circuit and multiple first signal lines configured to provide signals to the gate drive circuit. The second power line includes a power line corner portion and a first power line portion, the first power line portion overlaps the first sealant region, and the first power line portion extends in a first direction. A target portion of each first signal line is at least located in the corner sealant region.

20 Claims, 15 Drawing Sheets

(51) Int. Cl.
   *H10K 71/00*   (2023.01)
   *H01L 25/18*   (2023.01)
   *H10K 59/12*   (2023.01)

(56) References Cited

U.S. PATENT DOCUMENTS

| | | | |
|---|---|---|---|
| 2017/0338295 A1* | 11/2017 | Lee | .................... H10K 59/873 |
| 2018/0033830 A1 | 2/2018 | Kim et al. | |
| 2018/0211609 A1 | 7/2018 | Wang et al. | |
| 2019/0140207 A1 | 5/2019 | Li et al. | |
| 2020/0064968 A1 | 2/2020 | Kim et al. | |
| 2020/0119127 A1 | 4/2020 | Tian et al. | |
| 2020/0152909 A1 | 5/2020 | Hwang et al. | |

FOREIGN PATENT DOCUMENTS

| | | |
|---|---|---|
| CN | 106681067 A | 5/2017 |
| CN | 106876609 A | 6/2017 |
| CN | 108598118 A | 9/2018 |
| CN | 111627332 A | 9/2020 |

OTHER PUBLICATIONS

International Search Report and Written Opinion for Application No. PCT/CN2020/118883, dated Jun. 22, 2021, 8 Pages.

\* cited by examiner

DISPLAY SUBSTRATE, METHOD FOR MANUFACTURING THE SAME AND DISPLAY DEVICE

CROSS-REFERENCE TO RELATED APPLICATIONS

This application is a continuation of U.S. patent application Ser. No. 17/432,371 filed on Aug. 19, 2021, which is the U.S. National Phase of International Application No. PCT/CN2020/118883 filed on Sep. 29, 2020, which are hereby incorporated by reference in their entireties.

TECHNICAL FIELD

The present disclosure relates to the field of display technologies, and in particular to a display substrate, a method for manufacturing the same and a display device.

BACKGROUND

A metal layer and an organic layer of an Organic Light-Emitting Diode (short for OLED) display device are extremely sensitive to water vapor and oxygen. When water vapor and oxygen penetrate into the display device, the metal layer and the organic layer may be oxidized, which causes a light-emitting area to shrink and the occurrence of a non-light-emitting part, and the non-light-emitting part caused by water vapor and oxygen will become larger with time, which speeds up the aging speed of the device and greatly shortens the service life of the display device. At present, in order to better prevent the inside of the display device from being corroded by water vapor and oxygen, the display device is generally encapsulated. There are many existing encapsulation methods, for example, frame encapsulation glue (such as Frit glue) and an encapsulation cover plate are used to encapsulate the display device.

SUMMARY

The present disclosure is to provide a display substrate, a method for manufacturing the same, and a display device.

In order to achieve the above objective, the present disclosure provides the following technical solutions:

In a first aspect, the present disclosure provides a display substrate, including: a display area and a non-display area surrounding the display area. The non-display area includes a sealant region surrounding the display area; the sealant region includes: a corner sealant region, a lead-in sealant region, and a first sealant region that are on a first side of the display area, and the first sealant region is located between the corner sealant region and the lead-in sealant region; the corner sealant region is provided with an encapsulation base layer; the non-display area is provided with a second power line, a gate drive circuit, and a plurality of first signal lines configured to provide a signal to the gate drive circuit. The second power line includes a power line corner portion and a first power line portion, the first power line portion overlaps the first sealant region, and the first power line portion extends in a first direction. A target portion of each of the first signal lines is at least located in the corner sealant region, and the target portion extends in a second direction; the first direction intersects the second direction; an orthographic projection of the target portion onto a base substrate of the display substrate is located between an orthographic projection of the encapsulation base layer onto the base substrate and an orthographic projection of the first power line portion onto the base substrate.

Optionally, a boundary of the power line corner portion away from the display area has a shape of an arc, the power line corner portion has a corner width along a curvature radius direction of the arc, and the corner width gradually becomes smaller along a direction of the first sealant region pointing to the corner sealant region.

Optionally, in the second direction, a width of the first power line portion is greater than a maximum value of the corner width.

Optionally, the orthographic projection of the encapsulation base layer onto the base substrate and an orthographic projection of the power line corner portion onto the base substrate are at least partially overlapped.

Optionally, at least part of the gate drive circuit is located between the display area and the corner sealant region, and the orthographic projection of the target portion onto the base substrate of the display substrate and an orthographic projection of the power line corner portion onto the base substrate are at least partially overlapped.

Optionally, the non-display area is further provided with a driving chip; each of the first signal lines further includes a first non-target portion and a second non-target portion, and the first non-target portion is coupled to the target portion and the second non-target portion; the first non-target portion is located on a side of the first power line portion facing away from the display area, at least part of the first non-target portion extends along the first direction, and the first non-target portion and the first power line portion are arranged in a same layer and made of a same material; and the second non-target portion is coupled to the driving chip, and the second non-target portion and the first non-target portion are arranged in different layers.

Optionally, both the second non-target portion and the target portion are arranged in a same layer and made of a same material as the encapsulation base layer.

Optionally, the display substrate further includes a first gate metal layer, and the encapsulation base layer and the first gate metal layer are arranged in a same layer and made of a same material.

Optionally, the display substrate further includes a first gate metal layer and a second gate metal layer; among the plurality of first signal lines, first target portions included in some of the first signal lines are arranged in a same layer and made of a same material as the first gate metal layer, and second target portions included in some other of the first signal lines are arranged in a same layer and made of a same material as the second gate metal layer; and orthographic projections of the first target portions onto the base substrate of the display substrate and orthographic projections of the second target portions onto the base substrate are alternately arranged and spaced apart.

Optionally, the sealant region further includes a second sealant region, the second sealant region surrounds other sides of the display area except the first side, and the encapsulation base layer extends to cover the second sealant region.

Optionally, the display substrate further includes the base substrate, a first gate insulation layer, a second gate insulation layer and an interlayer insulation layer that are sequentially stacked on the base substrate in a direction away from the base substrate, the encapsulation base layer is located between the first gate insulation layer and the second gate insulation layer. A plurality of first via holes are provided on the encapsulation base layer. The display substrate is further provided with a plurality of groups of first sub-via holes corresponding to the plurality of first via holes in one-to-one manner, and each group of first sub-via holes includes a plurality of first sub-via holes, where orthographic projections of the plurality of first sub-via holes onto the base substrate are located within an orthographic projection of a corresponding one of the first via holes onto the base substrate, and each of the first sub-via holes penetrates the interlayer insulation layer, the second gate insulation layer and the first gate insulation layer.

Optionally, the second power line further includes a second power line portion, the second power line portion is electrically coupled to the power line corner portion, and the second power line portion surrounds the other sides of the display area except the first side; and an orthographic projection of the second power line portion onto the base substrate overlaps the orthographic projection of the encapsulation base layer onto the base substrate, and the second power line portion and the encapsulation base layer are electrically coupled at an overlapping position.

Optionally, the encapsulation base layer located in the second sealant region includes a main body portion and a plurality of conductive connection portions, and the main body portion surrounds the other sides of the display area except the first side, the plurality of conductive connection portions is electrically coupled to the main body portion, and the plurality of conductive connection portions is arranged at intervals along an extending direction of the main body portion; an orthographic projection of each of the conductive connection portions onto the base substrate of the display substrate overlaps an orthographic projection of the second power line portion onto the base substrate, and the second power line portion is electrically coupled to the conductive connection portions at respective overlapping positions.

Optionally, the main body portion and the plurality of conductive connection portions are formed as an integral structure.

Optionally, a plurality of second via holes are provided on the first power line portion.

Optionally, the non-display area is further provided with a first power line, and the first power line includes: a transmission portion and two first lead-in portions coupled to the transmission portion; the transmission portion is located between the display area and the first power line portion, and the transmission portion extends along the first direction; the two first lead-in portions are located on a side of the transmission portion facing away from the display area, the first lead-in portions extend along the second direction, and at least a part of the first lead-in portions is located in the lead-in sealant region.

Optionally, a plurality of third via holes are provided on the part of the first lead-in portion located in the lead-in sealant region.

In a second aspect, based on the above technical solutions of the display substrate, the present disclosure provides a display device including the above display substrate.

Optionally, the display device further includes an encapsulation cover plate arranged opposite to the display substrate, and the encapsulation cover plate and the display substrate are sealed through frame encapsulation glues arranged in the sealant region.

In a third aspect, based on the above technical solutions of the display substrate, the present disclosure provides a method for manufacturing a display substrate. The display substrate includes: a display area and a non-display area surrounding the display area, and the non-display area includes a sealant region surrounding the display area; the sealant region includes: a corner sealant region, a lead-in sealant region, and a first sealant region that are on a first side of the display area, and the first sealant region is located between the corner sealant region and the lead-in sealant region. The manufacturing method includes:

manufacturing an encapsulation base layer in the corner sealant region; and manufacturing, in the non-display area, a second power line, a gate drive circuit, and a plurality of first signal lines configured to provide a signal to the gate drive circuit, where the second power line includes a power line corner portion and a first power line portion, the first power line portion overlaps the first sealant region, and the first power line portion extends in a first direction;

a target portion of each of the first signal lines is at least located in the corner sealant region, and the target portion extends in a second direction; the first direction intersects the second direction; an orthographic projection of the target portion onto a base substrate of the display substrate is located between an orthographic projection of the encapsulation base layer onto the base substrate and an orthographic projection of the first power line portion onto the base substrate.

BRIEF DESCRIPTION OF THE DRAWINGS

The drawings described herein are used to provide a further understanding of the present disclosure and constitute a part of the present disclosure. The exemplary embodiments and descriptions of the present disclosure are used to explain the present disclosure, and do not constitute an improper limitation of the present disclosure. In the drawings.

DETAILED DESCRIPTION

Figure 1:
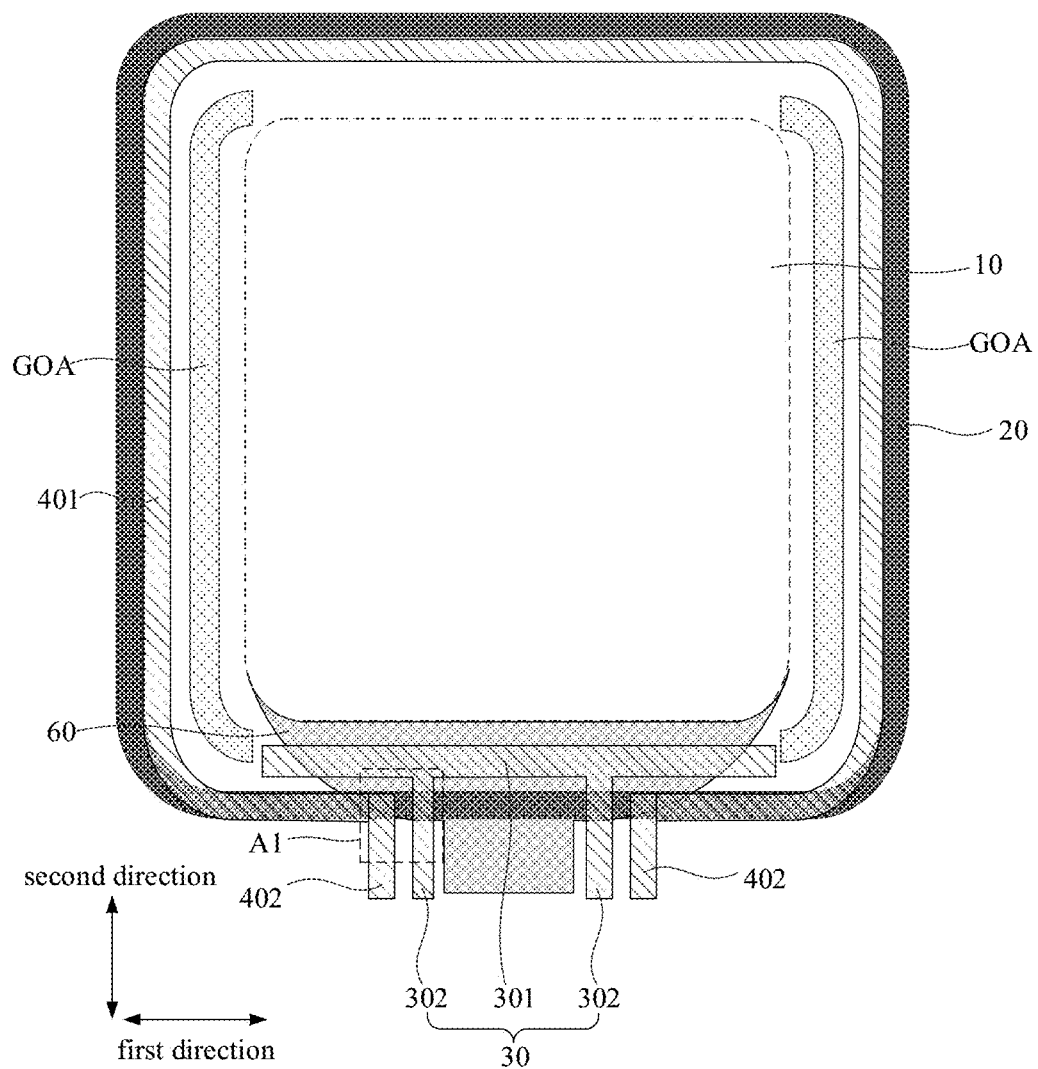
FIG. 1 is a first schematic structural diagram of a display substrate provided by an embodiment of the present disclosure.

In order to further illustrate a display substrate, a method for manufacturing the same, and a display device provided by embodiments of the present disclosure, a detailed description will be given below in conjunction with the accompanying drawings of the specification.

When a display device is encapsulated with Frit glue and an encapsulation cover plate, a Frit glue layer surrounding the display device is formed in the peripheral area of the display device, the encapsulation cover plate is covered on the display device, and the Frit glue is cured by a laser sintering process, so that a functional structure in the display device is encapsulated between a base substrate of the display device and the encapsulation cover plate. However, the laser sintering process may cause the Frit glue to narrow, and if the Frit glue is narrowed severely, it may affect the encapsulation effect of the OLED device, resulting in the Frit glue being unable to effectively prevent water vapor and oxygen from eroding the display device.

Referring to FIG. 17, FIG. 18, FIG. 19 and FIG. 20, embodiments of the present disclosure provide a display substrate, including: a display area 10 and a non-display area surrounding the display area 10. The non-display area includes a sealant region 20 surrounding the display area. The sealant region 20 includes: a corner sealant region 201, a lead-in sealant region 202, and a first sealant region 203 that are on a first side of the display area 10. The first sealant region 203 is located between the corner sealant region 201 and the lead-in sealant region 202. The corner sealant region 201 is provided with an encapsulation base layer 21. The non-display area is provided with a second power line 40, a gate drive circuit (GOA), and a plurality of first signal lines 70 used to provide a signal to the GOA.

The second power line 40 includes a power line corner portion 4011 and a first power line portion 4012, the first power line portion 4012 overlaps the first sealant region 203, and the first power line portion 4012 extends in a first direction.

A target portion 701 of each of the first signal lines 70 is at least located in the corner sealant region 201, and the target portion 701 extends along a second direction; the first direction intersects the second direction; an orthographic projection of the target portion 701 onto a base substrate of the display substrate is located between an orthographic projection of the encapsulation base layer 21 onto the base substrate and an orthographic projection of the first power line portion 4012 onto the base substrate.

Specifically, the display substrate includes the display area 10 and the non-display area. Illustratively, the display area 10 is a rectangle, and the non-display area completely surrounds the display area 10.

The non-display area includes a sealant region surrounding the display area. The sealant region includes two corner sealant regions 201, a lead-in sealant region 202 and two first sealant regions 203. The corner sealant region 201, the lead-in sealant region 202, and the first sealant regions 203 are all located on the first side of the display area, and the first side is a side where a lower frame of the display substrate is located. Exemplarily, the incoming sealant region 202 is located in the middle of the lower frame of the display substrate, the two corner sealant regions 201 are respectively located at a lower left corner and a lower right corner of the display substrate, and the two first sealant regions 203 are located between the two corner sealant regions 201 and the lead-in sealant region 202, respectively.

It is worth noting that the sealant region also includes a second sealant region 204, which surrounds the second, third, and fourth sides of the display area, the second side is opposite to the first side, and the third side and the fourth side are opposite. Exemplarily, the third side is located on a left side of the display area, and the fourth side is located on a right side of the display area.

The display substrate further includes an encapsulation base layer 21, at least a part of the encapsulation base layer 21 is located in the corner sealant region 201, and the encapsulation base layer 21 further includes another part located in the second sealant region 204.

The display substrate further includes a second power line 40. Illustratively, the second power line 40 includes a negative power signal line VSS. Exemplarily, the second power line 40 includes two power line corner portions 4011 and two first power line portions 4012. The power line portions 4011 are located in the corner sealant regions 201 in a one-to-one correspondence. The first power line portions 4012 are located in the first sealant regions 203 in a one-to-one correspondence. The second power line 40 also includes a second power line portion 4013, and the second power line portion 4013 surrounds the second side, the third side and the fourth side of the display area.

Figure 17:
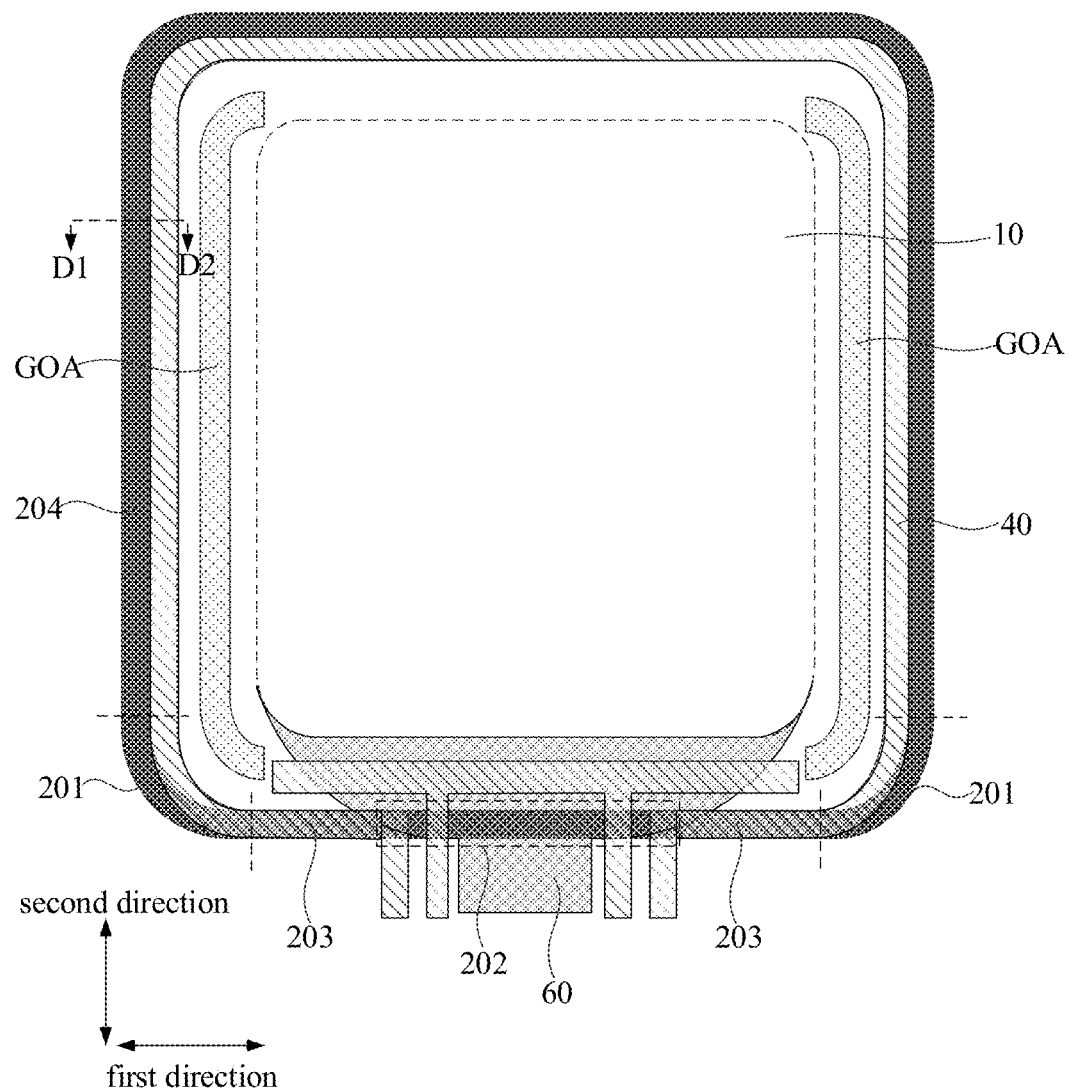
FIG. 17 is a third schematic structural diagram of a display substrate provided by an embodiment of the present disclosure.
Figure 20:
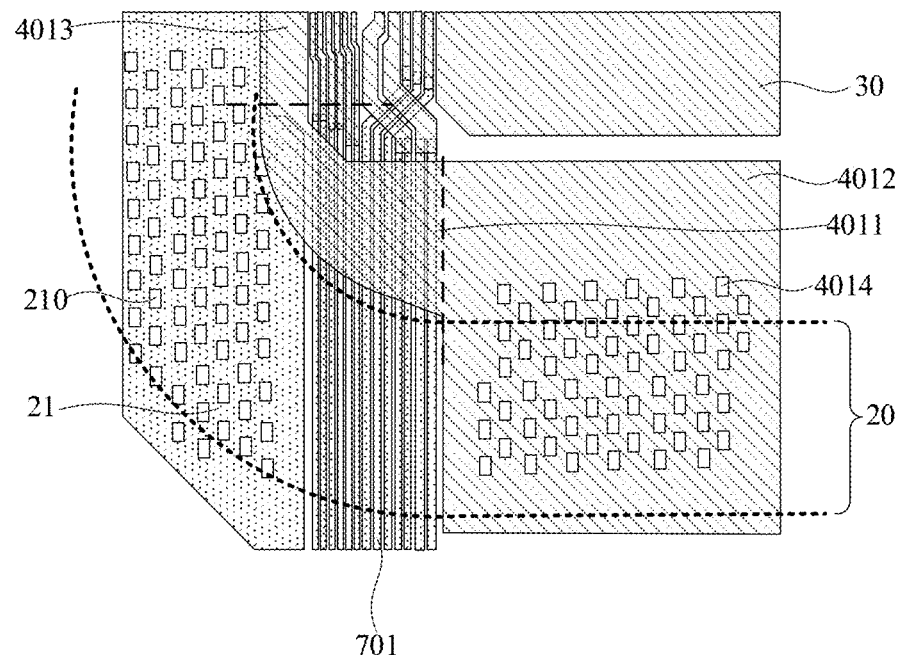
FIG. 20 is an enlarged schematic diagram of part A4 in FIG. 19.
Figure 21:
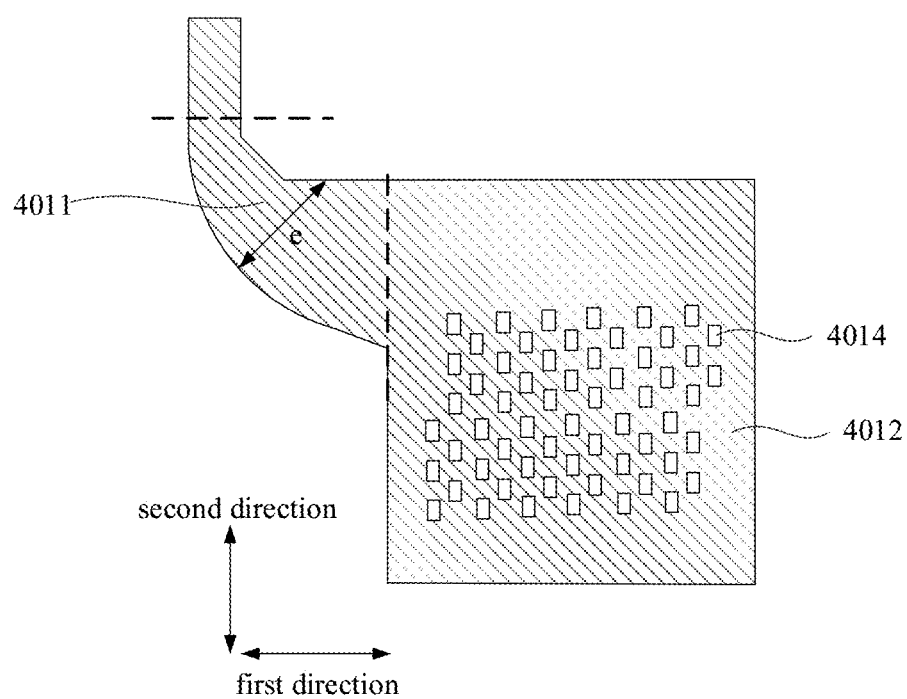
FIG. 21 is a schematic diagram of the second power line in FIG. 20.

Exemplarily, the power line corner portion 4011 overlaps the corner sealant region 201; or, as shown in FIG. 17, FIG. 20 and FIG. 21, the power line corner portion 4011 and the corner sealant region 201 do not overlap.

Figure 18:
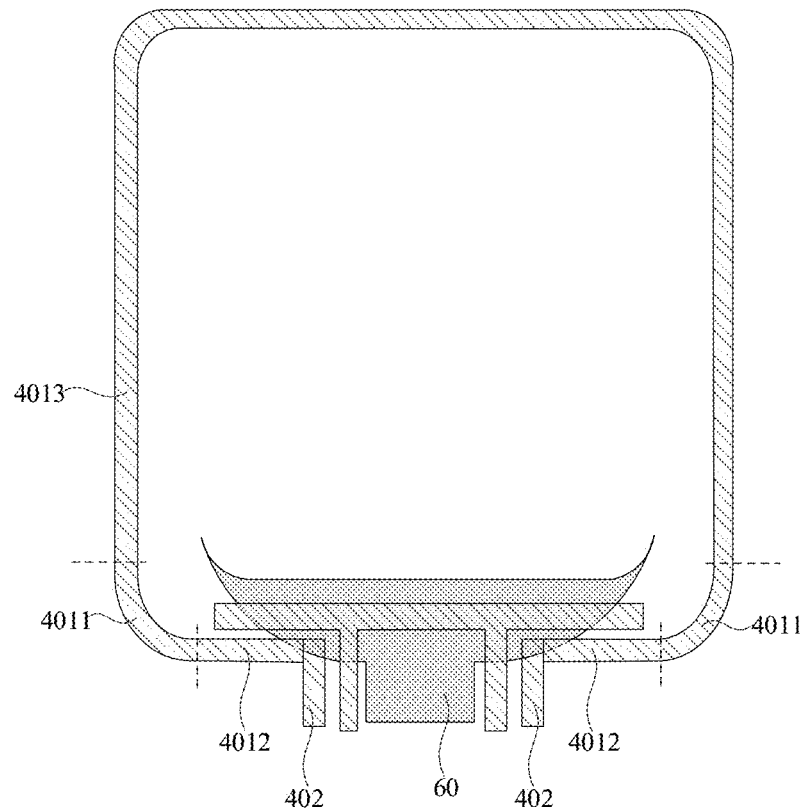
FIG. 18 is a schematic diagram of a layout of the first power line and the second power line in FIG. 17.

As shown in FIG. 1, for example, the second power line 40 includes a peripheral portion 401 and two second lead-in portions 402. As shown in FIG. 18, the peripheral portion 401 includes: two power line corner portions 4011, two first power line portions 4012 and a second power line portion 4013.

The display substrate further includes a gate drive circuit (GOA). Illustratively, the gate drive circuit (GOA) includes shift register units respectively corresponding to gate lines in the display substrate, which are configured to provide scan signals to the gate lines in the display substrate. The display substrate further includes a plurality of first signal lines 70 for providing signals to the gate drive circuit (GOA). The specific types of the plurality of first signal lines 70 are various, for example, the plurality of first signal lines 70 include a frame start signal line, a clock signal line, a first level signal line, a second level signal line, and the like. The gate drive circuit (GOA) is located on the left and right sides of the display area, and each of the first signal lines 70 is electrically coupled to the gate drive circuit (GOA) and a driving chip in the display substrate.

The target portion 701 of each of the first signal lines 70 is at least located in the corner sealant region 201, and the target portion 701 extends along the second direction. Exemplarily, the target portions 701 of the plurality of first signal lines 70 are arranged at intervals along the first direction.

According to the specific structure of the display substrate provided by the embodiments of the present disclosure, the orthographic projections of the target portions 701 onto the base substrate are arranged between the orthographic projection of the encapsulation base layer 21 onto the base substrate and the orthographic projection of first power line portion 4012 onto the base substrate in the display substrate provided by the embodiments of the present disclosure. Therefore, in the corner sealant region 201 and the first sealant region 203, the encapsulation base layer 21, the target portions 701 of the first signal lines 70 and the first power line portion 4012 together serve as an encapsulation base in contact with frame sealants or frame encapsulation glues, thereby effectively increasing an contact area between the frame sealants and the display substrate, improving the adhesion or adhesive force between the frame sealants and the display substrate, and ensuring a good encapsulating effect.

In addition, in the display substrate provided by the embodiments of the present disclosure, in the corner sealant region 201 and the first sealant region 203, the encapsulation base layer 21, the target portions 701 of the first signal lines 70 and the first power line portion 4012 together serve as the encapsulation base in contact with frame sealants, which avoids a large-area encapsulation base layer 21 formed in the corner sealant region 201 and the first sealant region 203, thereby effectively saving the manufacturing cost of the display substrate.

As shown in FIG. 21, in some embodiments, the boundary of the power line corner portion 4011 away from the display area has a shape of an arc. Along the curvature radius direction of the arc, the power line corner portion 4011 has a corner width e, and the corner width e gradually becomes smaller along a direction from the first sealant region 203 to the corner sealant region 201.

Specifically, an orthographic projection of the power line corner portion 4011 onto the base substrate partly overlaps the orthographic projections of the plurality of first signal lines 70 onto the base substrate.

In the above arrangement, the corner width e gradually becomes smaller in a direction of the first sealant region 203 pointing to the corner sealant region 201, and an overlapping area of the second power line 40 and the target portions 701 of the first signal lines 70 in the corner sealant region 201 is gradually reduced, thereby better reducing a parasitic capacitance formed between the second power line 40 and the target portions 701 of the first signal line 70, and improving the signal transmission stability of the first signal line 70.

In addition, in a case that the target portions 701 of the first signal lines 70 are made of the same material and in the same layer as a first gate metal layer in the display substrate, and the second power line 40 is made of the same material and in the same layer as a first source and drain metal layer in the display substrate, the second power line 40 is located on a side of the target portions 701 of the first signal lines 70 facing away from the base substrate. When it is designed that the overlapping area of the second power line 40 and the target portions 701 of the first signal lines 70 in the corner sealant region 201 is gradually reduced, an area of the target portions 701 of the first signal lines 70 that is shielded by the second power line 40 can be gradually reduced. Since the reflective performance of the target portions 701 of the first signal lines 70 is better than that of the second power line 40, the above arrangement can effectively improve a speed of laser sintering during the encapsulating process.

As shown in FIG. 21, in some embodiments, in the second direction, a width of the first power line portion 4012 is greater than a maximum value of the corner width e.

Specifically, since the first power line portion 4012 can be reused as an encapsulation base and can contact the frame sealants, and the width of the first power line portion 4012 is set to be greater than the maximum value of the corner width, a contact area between the first power line portion 4012 and the frame sealants can be better improved, which is more conducive to enhancing the reflection effect of a laser during the encapsulating process and improves the encapsulating efficiency.

Moreover, setting the width of the first power line portion 4012 to be greater than the maximum value of the corner width is also beneficial to increase the overall area of the second power line 40 and is beneficial to reduce a voltage drop on the second power line 40.

In some embodiments, an orthographic projection of the encapsulation base layer 21 onto the base substrate and an orthographic projection of the power line corner portion 4011 onto the base substrate are at least partially overlapped.

The above arrangement can further reduce the flatness of a surface of the display substrate facing away from the base substrate and in the corner sealant region 201, thereby better enhancing the bonding strength between the frame sealants and the display substrate, and effectively improving the encapsulation effect of the display substrate in the corner sealant region 201.

Figure 19:
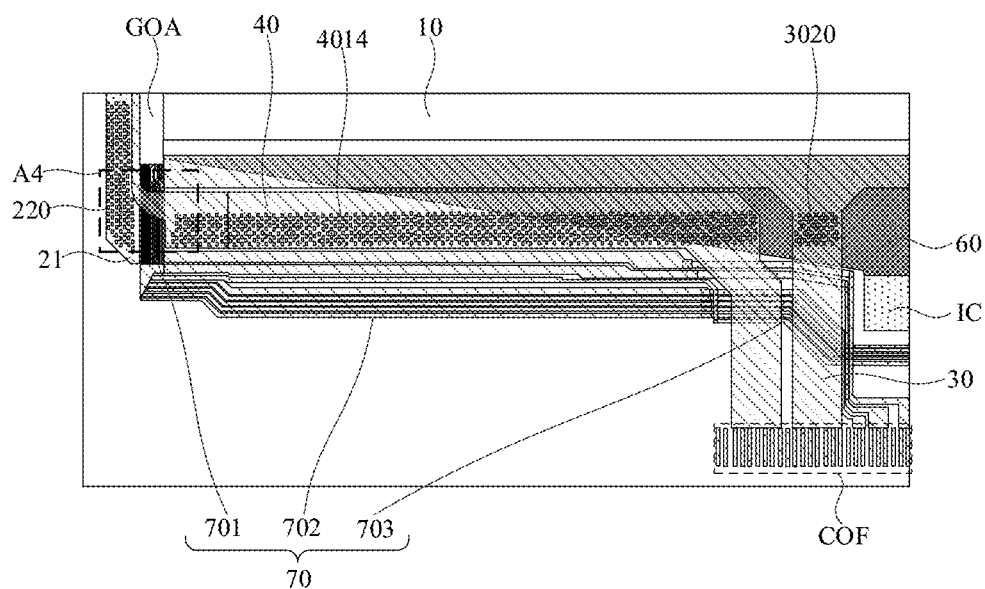
FIG. 19 is an enlarged schematic diagram of a lower left frame in FIG. 17.

As shown in FIG. 17, FIG. 19 and FIG. 20, in some embodiments, at least part of the gate drive circuit (GOA) is located between the display area and the corner sealant region 201, and an orthographic projection of the target portion onto the base substrate of the display substrate at least partially overlaps an orthographic projection of the power line corner portion 4011 onto the base substrate.

Specifically, at least portion of the gate drive circuit (GOA) is located between the display area and the corner sealant region 201, one end of the first signal line 70 passes through the corner sealant region 201 and is electrically coupled to the gate drive circuit (GOA), and the other end of the first signal line 70 is electrically coupled to a driving chip in the display substrate.

The target portions 701 of the first signal lines 70 are located in the corner sealant region 201, and the orthographic projection of the target portion onto the base substrate of the display substrate and the orthographic projection of the power line corner portion 4011 onto the base substrate are at least partially overlapped.

As shown in FIG. 19, in some embodiments, the non-display area is further provided with a driving chip (IC); the first signal line 70 further includes a first non-target portion 702 and a second non-target portion 703. The first non-target portion 702 is coupled to the target portion 701 and the second non-target portion 703.

The first non-target portion 702 is located on a side of the first power line portion 4012 facing away from the display area, at least part of the first non-target portion 702 extends along the first direction, and the first non-target portion 702 and the first power line portion 4012 are arranged in a same layer and made of a same material.

The second non-target portion 703 is coupled to the driving chip IC, and the second non-target portion 703 and the first non-target portion 702 are arranged in different layers.

Specifically, the first signal line 70 includes the target portion 701, the first non-target portion 702, and the second non-target portion 703. The target portion 701 is electrically coupled to the gate drive circuit (GOA). The target portion 702 is coupled to the target portion 701 and the second non-target portion 703, and the second non-target portion 703 is coupled to the driving chip IC.

As described above, the first non-target portion 702 and the first power line portion 4012 are arranged in the same layer and made of the same material, so that the first non-target portion 702 and the first power line portion 4012 can be formed in a same patterning process. Therefore, the process of manufacturing the display substrate is effectively simplified, and the manufacturing cost is saved.

In above arrangement, the second non-target portion 703 and the first non-target portion 702 are in different layers, which avoids short-circuiting between the second non-target portion 703 and functional layers (such as a first power line 30 and a second power line 40) in the display substrate that are made of the same material and in the same layer as the first non-target portion 702.

In some embodiments, the second non-target portion 703 and the target portion 701 are both arranged in the same layer and made of the same material as the encapsulation base layer 21.

The above arrangement makes the target portion 701 and the second power line 40 are not short-circuited, when the target portion 701 is coupled to the gate drive circuit (GOA). Furthermore, the above arrangement also enables the second non-target portion 703 and the target portion to be formed with the encapsulation base layer 21 in one patterning process, thereby effectively simplifying the manufacturing process of the display substrate and saving the manufacturing cost.

In some embodiments, the display substrate further includes a first gate metal layer, and the encapsulation base layer 21 and the first gate metal layer are arranged in a same layer and made of a same material.

As described above, the encapsulation base layer 21 and the first gate metal layer are arranged in the same layer and made of the same material, so that the encapsulation base layer 21 and the first gate metal layer can be formed in one patterning process, thereby effectively simplifying the manufacturing process of the display substrate and saving the manufacturing cost.

In addition, a metal material used by the first gate metal layer has a better light reflection effect, and the encapsulation base layer 21 and the first gate metal layer are arranged in the same layer and made of the same material, which is more conducive to speeding up the laser sintering process.

In some embodiments, the display substrate further includes a first gate metal layer and a second gate metal layer. Among the plurality of first signal lines 70, some of the first signal lines 70 include first target portions, and some other of the first signal lines 70 include second target portions, where the first target portions are arranged in a same layer and made of a same material as the first gate metal layer, and the second target portions are arranged in a same layer and made of a same material as the second gate metal layer. Orthographic projection of the first target portions onto the base substrate of the display substrate and orthographic projections of the second target portion onto the base substrate are alternately arranged and spaced apart.

The above-mentioned arrangement that the first target portion and the first gate metal layer are in the same layer and made of the same material enables the first target portion and the first gate metal layer to be formed at the same time in a same patterning process, thereby effectively simplifying the manufacturing process of the display substrate and saving the manufacturing cost.

The above-mentioned arrangement that the second target portion and the second gate metal layer are in the same layer and made of the same material enables the second target portion and the second gate metal layer to be formed at the same time in a same patterning process, thereby effectively simplifying the manufacturing process of the display substrate and saving the manufacturing cost.

The above-mentioned arrangement that the orthographic projection of the first target portion onto the base substrate of the display substrate and the orthographic projection of the second target portion onto the base substrate are alternately arranged and spaced apart further enhances the degree of unevenness of a surface of the display substrate in the corner sealant region 201 in contact with the frame sealant, thereby effectively improving the packaging effect of the display substrate.

As shown in FIG. 17, in some embodiments, the sealant region further includes a second sealant region 204, and the second sealant region 204 surrounds other sides of the display area except the first side. The encapsulation base layer 21 extends to cover the second sealant region 204.

Specifically, the second sealant region 204 surrounds the second side, the third side, and the fourth side of the display substrate, and the encapsulation base layer 21 is arranged extending to cover the second sealant region 204, so that during laser sintering of the Frit glue, the encapsulation base layer 21 located in the second sealant region 204 can effectively reflect the laser, thereby better speeding up the sintering process.

Figure 22:
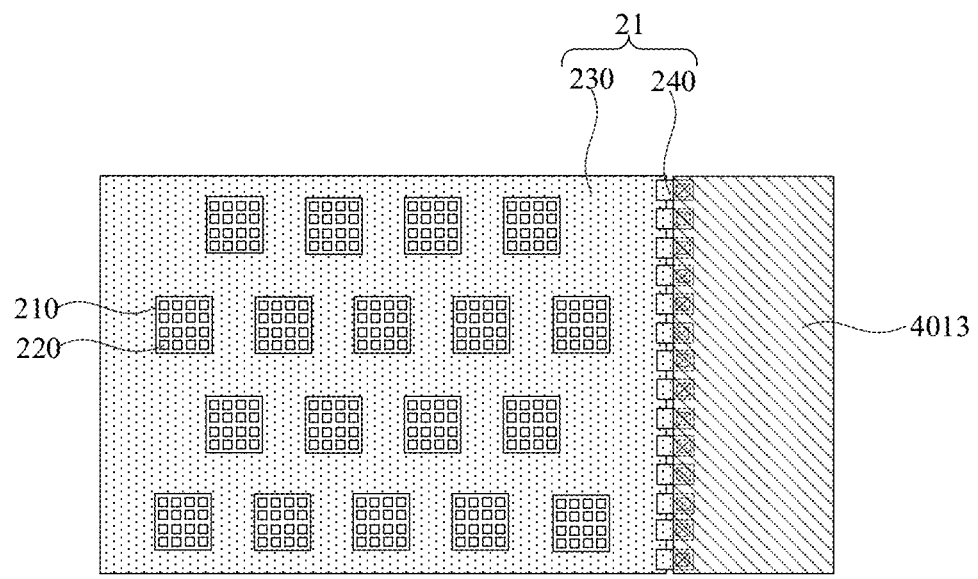
FIG. 22 is a schematic cross-sectional view taken along a direction of D1 and D2 in FIG. 17.
Figure 23:
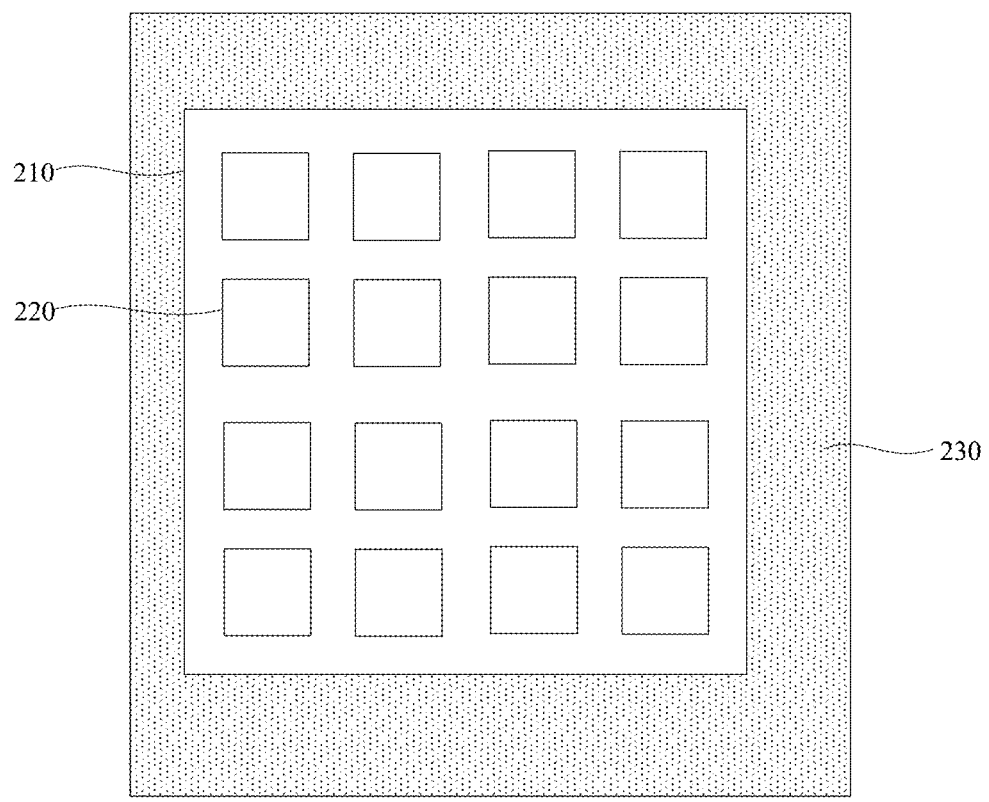
FIG. 23 is a schematic diagram of a layout of first via holes and first sub-via holes.

As shown in FIG. 17, FIG. 22, and FIG. 23, in some embodiments, the display substrate further includes a base substrate, a first gate insulation layer 93, a second gate insulation layer 94 and an interlayer insulation layer 95 that are sequentially stacked on the base substrate in a direction away from the base substrate. The encapsulation base layer 21 is located between the first gate insulation layer 93 and the second gate insulation layer 94.

A plurality of first via holes 210 are provided on the encapsulation base layer 21.

The display substrate is further provided with a plurality of groups of first sub-via holes 220 corresponding to the plurality of first via holes 210 in one-to-one manner, and each group of first sub-via holes 220 includes a plurality of first sub-via holes 220, where orthographic projections of the plurality of first sub-via holes 220 onto the base substrate are located within an orthographic projection of a corresponding first via hole 210 onto the base substrate. Each of the first sub-via holes 220 penetrates the interlayer insulation layer 95, the second gate insulation layer 94 and the first gate insulation layer 93.

The display substrate further includes a barrier layer 91 and a buffer layer 92 that are located between the base substrate and the first gate insulation layer 93. Before encapsulation is performed after the display substrate has been manufactured, the first sub-via hole 220 can expose the buffer layer 92, so that when the Frit glue is subsequently formed, the Frit glue can penetrate into the first sub-via holes 220 and contact the buffer layer 92. After laser sintering, the encapsulation cover plate can be firmly bonded or attached to the display substrate together.

Moreover, as described above, a plurality of first via holes 210 and a plurality of groups of first sub-via holes 220 are provided on the encapsulation base layer 21, which effectively enhances the unevenness of a surface of the display substrate in contact with the frame sealant. Thus, the encapsulating or packaging effect of the display substrate is effectively improved.

As shown in FIG. 22, in some embodiments, the second power line 40 further includes a second power line portion 4013, the second power line portion 4013 is electrically coupled to the power line corner portion 4011. The second power line portion 4013 surrounds the other sides of the display area except the first side. An orthographic projection of the second power line portion 4013 onto the base substrate overlaps an orthographic projection of the encapsulation base layer 21 onto the base substrate, and the second power line portion 4013 and the encapsulation base layer 21 are electrically coupled at the overlapping position.

Specifically, the second power line 40 further includes the second power line portion 4013 that surrounds the second side, the third side, and the fourth side of the display area. Two ends of the second power line portion 4013 are electrically coupled to the two power line portions 4011 in a one-to-one correspondence.

Exemplarily, on the second, third, and fourth sides, the orthographic projection of the second power line portion 4013 on the base substrate is equal to the orthographic projection of the encapsulation base layer 21 on the base substrate. Overlap, at the overlap of the second side, the third side, and the fourth side, the second power line portion 4013 is electrically coupled to the encapsulation base layer 21.

The above-mentioned electrical connection of the second power line portion 4013 and the encapsulation base layer 21 not only provides the encapsulation base layer 21 with a voltage signal with a stable potential, thereby preventing the encapsulation base layer 21 from being in a floating state; but also reduces a resistance of the second power line 40, thereby effectively reducing the voltage drop at the second power line 40.

As shown in FIG. 22, in some embodiments, the encapsulation base layer 21 located in the second sealant region 204 includes a main body portion 230 and a plurality of conductive connection portions 240, and the main body portion 230 surrounds the other sides of the display area except the first side. The plurality of conductive connection portions 240 are electrically coupled to the main body portion 230, and the plurality of conductive connection portions 240 are arranged at intervals along an extending direction of the main body portion 230. An orthographic projection of each of the conductive connection portions onto the base substrate of the display substrate overlaps an orthographic projection of the second power line portion 4013 onto the base substrate, and the second power line portion 4013 is electrically coupled to the conductive connection portions at respective overlapping positions.

In the display substrate provided by the foregoing embodiments, the convex-concave degree of the surface of the display substrate in contact with the frame sealants at the edge of the second sealant region 204 is effectively enhanced, thereby effectively improving the encapsulation effect of the display substrate.

In some embodiments, the main body portion 230 and the plurality of conductive connection parts 240 are provided as an integral structure.

The above arrangement enables the main body portion 230 and the plurality of conductive connection portions 240 to be formed in a same patterning process, which not only ensures the connection performance between the main body portion 230 and the plurality of conductive connection portions 240, but also simplifies the fabricating process of the display substrate, thereby reducing the production cost.

Figure 24:
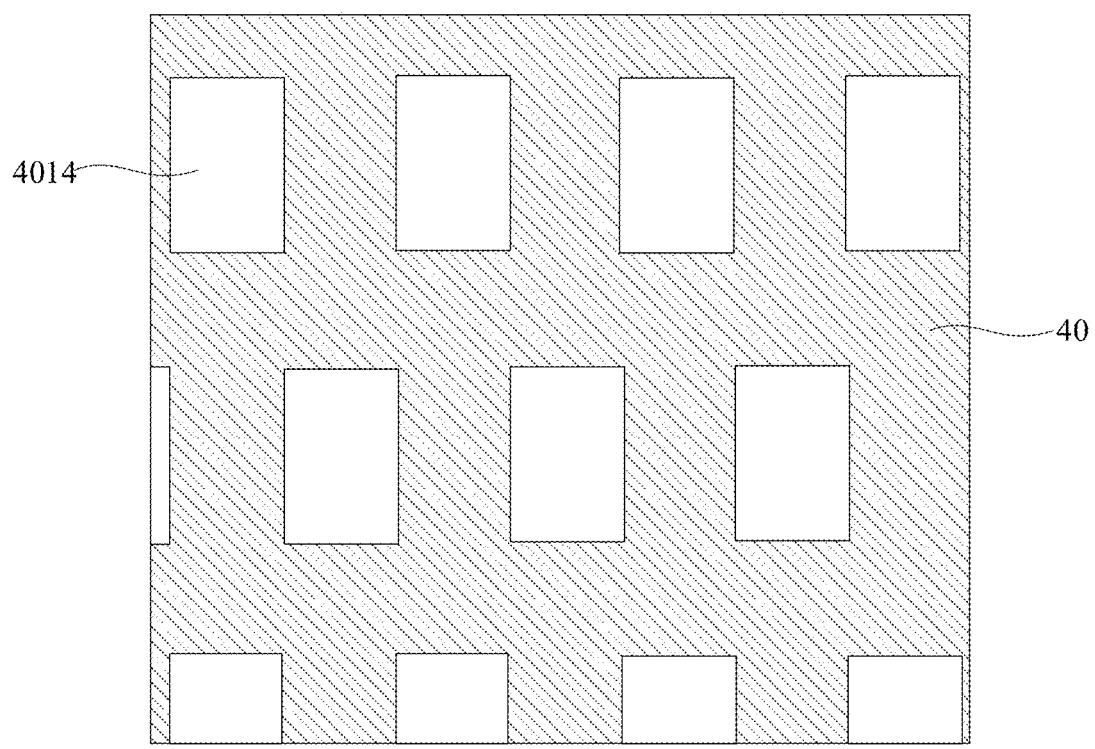
FIG. 24 is a schematic diagram of a layout of second via holes.

As shown in FIG. 24, in some embodiments, a plurality of second via holes 4014 are provided on the first power line portion 4012.

Exemplarily, the plurality of second via holes 4014 are distributed in an array, and may be divided into multiple rows of second via holes 4014 arranged along the second direction, and each row of second via holes 4014 includes multiple second via holes 4014 arranged at intervals along the first direction. The second via holes 4014 in two adjacent rows are staggered or unaligned in the second direction.

Exemplarily, an orthographic projection of each second via hole 4014 onto the base substrate is a rectangle, the size of the second via hole 4014 in the first direction is 45 µm, and the size of the second via hole 4014 in the second direction is 70 µm.

Exemplarily, in the first direction, a distance between any adjacent second via holes 4014 is 45 µm.

In the display substrate, the first power line portion 4012 is located on a side of the interlayer insulation layer 95 facing away from the base substrate, and the plurality of second via holes 4014 provided on the first power line portion 4012 can expose the interlayer insulation layer 95, so that when the frame sealants is formed on the display substrate, the frame sealants can contact the interlayer insulation layer 95 through the plurality of second via holes 4014. Thus, after laser sintering, the encapsulation cover plate and the display substrate can be firmly bonded together. Moreover, the first power line portion 4012 is made of a metal material, which can effectively reflect the laser light, thereby better speeding up the sintering process.

In some embodiments, the plurality of second via holes 4014 are provided on a portion of the second lead-in portion 402 that is located in the lead-in sealant region 202.

As shown in FIG. 1 and FIG. 18, in some embodiments, the non-display area is further provided with a first power line 30, and the first power line 30 includes: a transmission portion 301 and two first lead-in portions 302 coupled to the transmission portion 301.

The transmission portion 301 is located between the display area 10 and the first power line portion 4012, and the transmission portion 301 extends along the first direction. The two first lead-in portions 302 are located on a side of the transmission portion 301 facing away from the display area, the first lead-in portions 302 extend along the second direction, and at least part of the first lead-in portions 302 is located in the lead-in sealant region 202.

Exemplarily, the first power line 30 includes a positive power supply signal line VDD.

The first power line 30 includes the transmission portion 301 and first lead-in portions 302 that are electrically coupled, the transmission portion 301 is located between the display area and the first lead-in portion 302, the transmission portion 301 extends in the first direction, and at least part of the first lead-in portions 302 extends in the second direction. For example, the first direction includes a horizontal direction, and the second direction includes a vertical direction. Exemplarily, the transmission portion 301 is located on the first side of the display substrate, the transmission portion 301 is located between the display area 10 and the first power line portion 4012, and the first lead-in portions 302 are located between the two second lead-in portions 402.

Exemplarily, the first power line 30 includes two first lead-in portions 302, each of the first lead-in portions 302 extends along the second direction, and the two first lead-in portions 302 are electrically coupled to the transmission portion 301. The two first lead-in portions 302 are spaced apart along the first direction, and both the two first lead-in portions 302 are located between the two second lead-in portions 402.

The part of the first lead-in portion 302 located in the lead-in sealant region 202 can be used as an encapsulation base to contact the frame sealant. Since the first lead-in portion 302 is made of a metal material, it can effectively reflect laser light, thereby better speeding up the sintering process.

As shown in FIG. 19, in some embodiments, a plurality of third via holes 3020 are provided on a part of the first lead-in portion 302 located in the lead-in sealant region 202.

Exemplarily, the plurality of third via holes 3020 are distributed in an array, and may be divided into multiple rows of third via holes 3020 arranged along the second direction, and each row of third via holes 3020 includes multiple third via holes 3020 arranged at intervals along the first direction. The third via holes 3020 in two adjacent rows are staggered or unaligned in the second direction.

Exemplarily, an orthographic projection of the third via hole 3020 onto the base substrate is a rectangle, the size of the third via hole 3020 in the first direction is 45 µm, and the size of the third via hole 3020 in the second direction is 70 µm.

Exemplarily, in the first direction, a distance between any adjacent third via holes 3020 is 45 µm.

In the display substrate, the first lead-in portion 302 is located on a side of the interlayer insulation layer 95 facing away from the base substrate, and the plurality of third via holes 3020 provided on the first lead-in portion 302 can expose the interlayer insulation layer 95, so that when the frame sealants is formed on the display substrate, the frame sealants can contact the interlayer insulation layer 95 through the plurality of third via holes 3020. Thus, after laser sintering, the encapsulation cover plate and the display substrate can be firmly bonded together.

Embodiments of the present disclosure also provide a display device, including the display substrate provided in the above-mentioned embodiments.

In the display substrate provided by the above embodiments, the orthographic projections of the target portions onto the base substrate are arranged between the orthographic projection of the encapsulation base layer 21 onto the base substrate and the orthographic projection of first power line portion 4012 onto the base substrate in the display substrate provided by the embodiments of the present disclosure. Therefore, in the corner sealant region 201 and the first sealant region 203, the encapsulation base layer 21, the target portions of the first signal lines 70, the power line corner portion 4011 and the first power line portion 4012 together serve as an encapsulation base in contact with the frame sealant, thereby effectively increasing a contact area between the frame sealants and the display substrate, improving the adhesion between the frame sealants and the display substrate, and ensuring a good encapsulating effect.

In addition, in the display substrate provided by the above embodiments of the present disclosure, in the corner sealant region 201 and the first sealant region 203, the encapsulation base layer 21, the target portions of the first signal lines 70 and the first power line portion 4012 together serve as an encapsulation base in contact with frame sealants, which avoids a large-area encapsulation base layer 21 formed in the corner sealant region 201 and the first sealant region 203, thereby effectively saving the manufacturing cost of the display substrate.

Therefore, when the display device provided by the embodiments of the present disclosure includes the above-mentioned display substrate, the display device also has the above-mentioned beneficial effects, which will not be repeated herein.

It should be noted that the display device may be any product or component with a display function, such as a TV, a monitor, a digital photo frame, a mobile phone, a tablet computer, and so on.

In some embodiments, the display device further includes an encapsulation cover plate arranged opposite to the display substrate, where the encapsulation cover plate and the display substrate are sealed through frame encapsulation glues arranged in the sealant region.

Embodiments of the present disclosure also provide a method for manufacturing a display substrate, which is used to manufacture the display substrate provided in the above-mentioned embodiments. The display substrate includes: a display area and a non-display area surrounding the display area, and the non-display area includes a sealant region surrounding the display area. The sealant region 20 includes: a corner sealant region 201, a lead-in sealant region 202, and a first sealant region 203 that are on a first side of the display area 10. The first sealant region 203 is located between the corner sealant region 201 and the lead-in sealant region 202. The manufacturing method includes:

manufacturing an encapsulation base layer 21 in the corner sealant region 201;

manufacturing, in the non-display area, a second power line 40, a gate drive circuit (GOA), and a plurality of first signal lines 70 for providing signals to the GOA, where the second power line 40 includes a power line corner portion 4011 and a first power line portion 4012, the first power line portion 4012 overlaps the first sealant region 203, and the first power line portion 4012 extends in a first direction;

where a target portion of each of the first signal lines 70 is at least located in the corner sealant region 201, and the target portion extends along a second direction; the first direction intersects the second direction; an orthographic projection of the target portion onto a base substrate of the display substrate is located between an orthographic projection of the encapsulation base layer 21 onto the base substrate and an orthographic projection of the first power line portion 4012 onto the base substrate.

In the display substrate manufactured by the manufacturing method provided by the embodiments of the present disclosure, the orthographic projections of the target portions onto the base substrate are arranged between the orthographic projection of the encapsulation base layer 21 onto the base substrate and the orthographic projection of first power line portion 4012 onto the base substrate in the display substrate provided by the embodiments of the present disclosure. Therefore, in the corner sealant region 201 and the first sealant region 203, the encapsulation base layer 21, the target portions of the first signal lines 70 and the first power line portion 4012 together serve as an encapsulation base in contact with frame sealants, thereby effectively increasing an contact area between the frame sealants and the display substrate, improving the adhesion between the frame sealants and the display substrate, and ensuring a good encapsulating effect.

In addition, in the display substrate manufactured by the manufacturing method provided by the embodiments of the present disclosure, in the corner sealant region 201 and the first sealant region 203, the encapsulation base layer 21, the target portions of the first signal lines 70 and the first power line portion 4012 together serve as the encapsulation base in contact with the frame sealants, which avoids a large-area encapsulation base layer 21 formed in the corner sealant region 201 and the first sealant region 203, thereby effectively saving the manufacturing cost of the display substrate.

Figure 2:
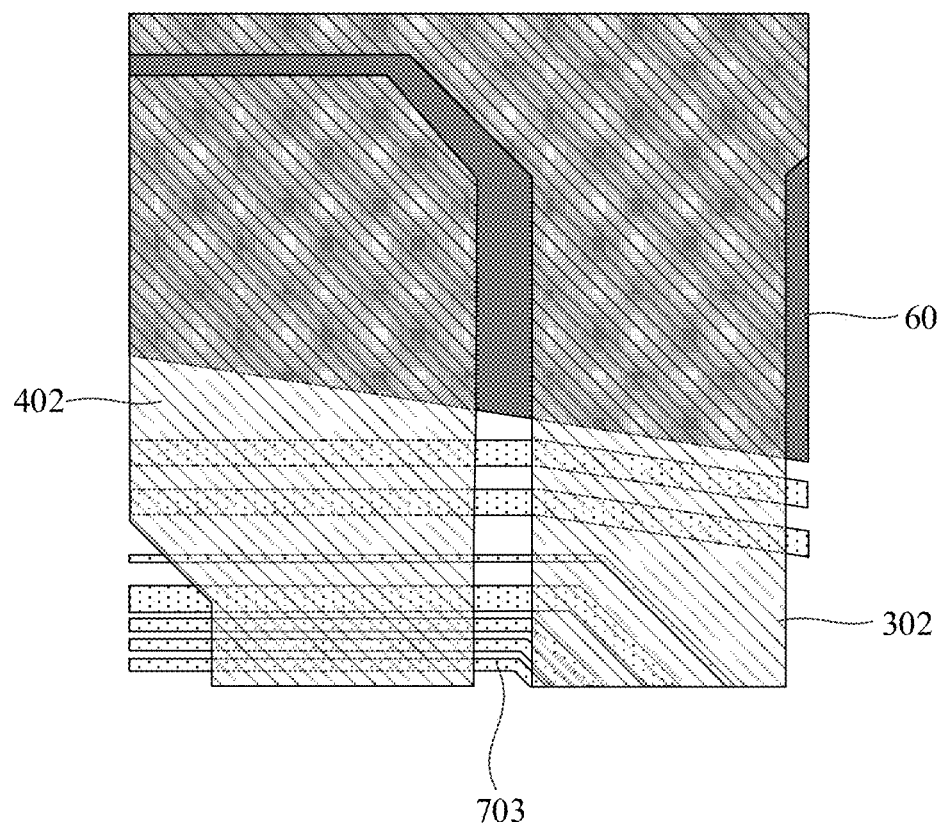
FIG. 2 is a first enlarged schematic diagram of part A1 in FIG. 1.
Figure 6:
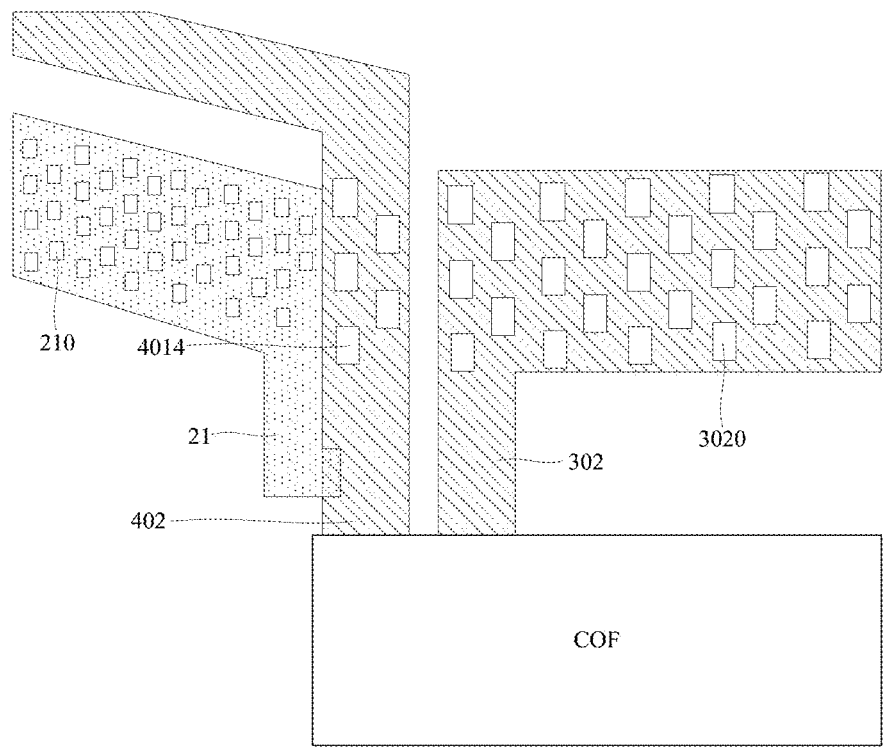
FIG. 6 is a first enlarged schematic diagram of part A2 in FIG. 5.

As shown in FIG. 1 and FIG. 17, in the display substrate provided by the present disclosure, on a side where a chip-on-film (COF) or a driving chip (IC) is arranged, a first power line 30 (such as a positive power line VDD) and a second power line 40 (such as a negative power line VSS) may be led out from a COF pin or an IC pin to form a lead-in region. Due to the limitation of the size of the COF or IC, a distance between VDD and VSS near the lead-in region of the display substrate is relatively short (as shown in FIG. 2 and FIG. 6, a distance between the second lead-in portion 402 and the first lead-in portion 302 is relatively short), generally in a range 50~100 μm. There is no wiring between VDD and VSS, so that the surface of VDD and VSS that face away from the base substrate of the display substrate and near the lead-in region is relatively flat.

In order to save the space of the lower frame of the display substrate (that is, a frame where the lead-in region is located), the VSS and VDD at the lower frame are generally reused as the frit encapsulation base at the same time. Since the distance between VDD and VSS near the lead-in region is small, and the surface of VDD and VSS that face away from the base substrate of the display substrate and near the lead-in region is relatively flat, an effective bonding width of the Frit glue between VDD and VSS near the lead-in region and the display substrate is small, so that when the laser is irradiated for encapsulation, the Frit glue located between VDD and VSS near the lead-in region is severely narrowed, which may easily cause water vapor and oxygen to invade the inside of the device from this position, causing the electrochemical corrosion risk to the display device.

Referring to FIG. 1, FIG. 3, FIG. 4, FIG. 7, FIG. 8 and FIG. 17, embodiments of the present disclosure provide a display substrate, including: a display area 10 and a non-display area surrounding the display area 10. The non-display area includes a sealant region 20, and the non-display area is provided with a first power line 30 and a second power line 40.

The first power line 30 includes: a transmission portion 301 and a first lead-in portion 302 coupled to the transmission portion 301, the transmission portion 301 is located between the display area and the first lead-in portion 302, the transmission portion 301 extends in a first direction, at least a part of the first lead-in portion 302 extends in a second direction, and the first direction intersects the second direction.

The second power line 40 includes: a peripheral portion 401 and two second lead-in portions 402; the peripheral portion 401 surrounds the display area, the peripheral portion 401 has an opening, and two ends of the peripheral portion 401 at the opening are coupled to the two second lead-in portions 402, respectively.

The first lead-in portion 302 is located between the two second lead-in portions 402; a first spacer area 51 and a second spacer area 52 are located between each second lead-in portion 402 and the corresponding first lead-in portion 302, the first spacer area 51 has a first distance or width d in the first direction, the second spacer area 52 has a second distance or width b in the first direction, and the first spacer area 51 and the sealant region 20 has a first overlapping area, and the second spacer area 52 does not overlap with the sealant region 20; the first distance d is greater than the second distance b.

Specifically, the display substrate includes the display area and the non-display area. Illustratively, the display area includes a circle and a rectangle, and the non-display area completely surrounds the display area.

The display substrate includes the first power line 30 and the second power line 40. Illustratively, the first power line 30 includes a positive power signal line VDD, and the second power line 40 includes a negative power signal line VSS.

The first power line 30 includes a transmission portion 301 and a first lead-in portion 302 that are electrically coupled. For example, the transmission portion 301 is located between the display area and the first lead-in portion 302. The transmission portion 301 extends in a first direction, and at least a part of the first lead-in portion 302 extends in a second direction; for example, the first direction includes a horizontal direction, and the second direction includes a vertical direction.

Figure 5:
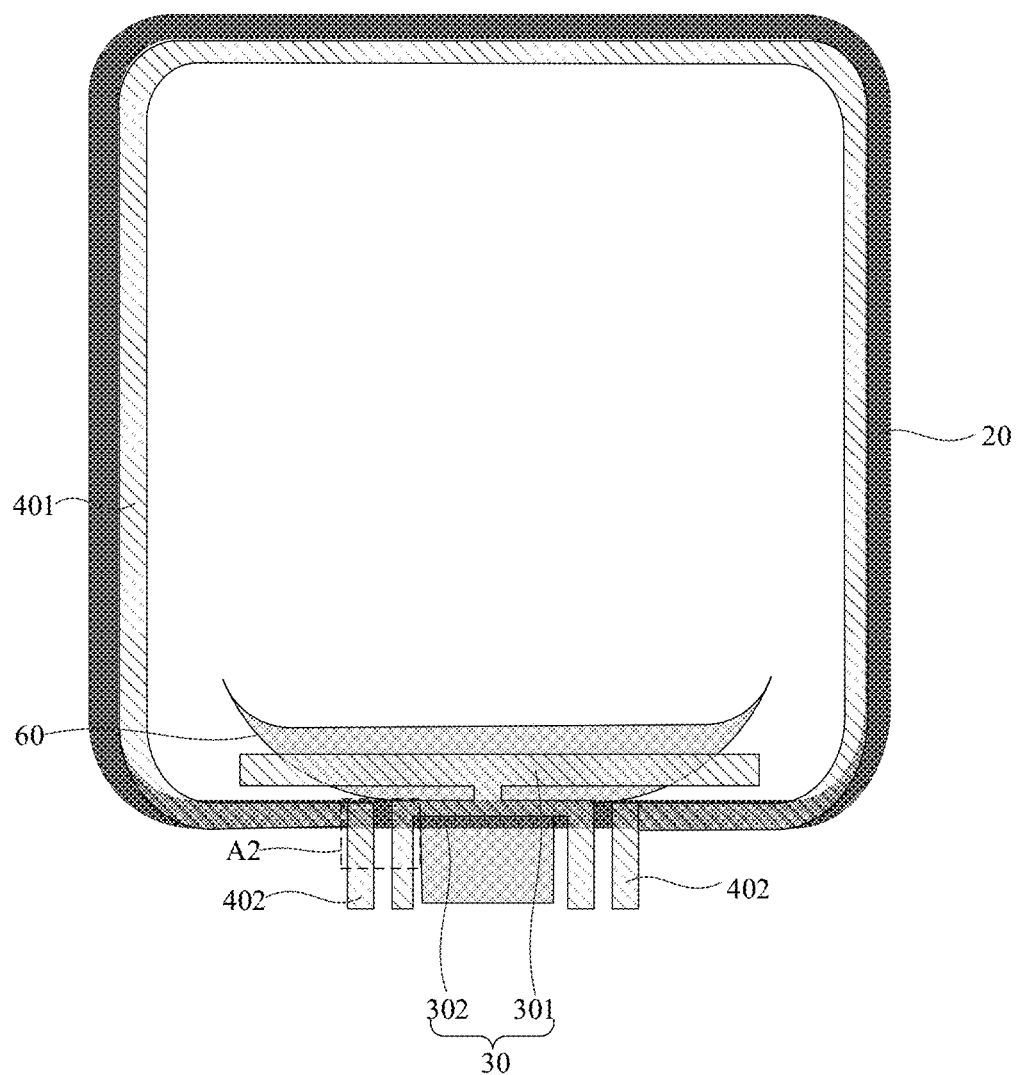
FIG. 5 is a second schematic structural diagram of a display substrate provided by an embodiment of the present disclosure.

It is worth noting that the specific shape and number of the first lead-in portion 302 are various. For example, as shown in FIG. 1, the first power line 30 includes two first lead-in portions 302, each of the first lead-in portions 302 extends along the second direction, the two first lead-in portions 302 are electrically coupled to the transmission portion 301, the two first lead-in portions 302 are arranged at intervals along the first direction, and both the two first lead-in portions 302 are located between the two second lead-in portions 402. Exemplarily, as shown in FIG. 5, the first power line 30 includes a first lead-in portion 302, the first lead-in portion 302 is formed in a door-like or gate-like structure, and a side of the first lead-in portion 302 close to the transmission portion 301 is electrically coupled to the transmission portion 301.

It should be noted that the display substrate may further include a power supply pattern located in the display area. For example, at least part of the power supply pattern extends along the second direction; the power supply pattern may be electrically coupled to the transmission portion 301. Exemplarily, the first lead-in portion 302 is electrically coupled to a pin bound to a flexible circuit board in the display substrate. The power supply pattern receives a first power signal transmitted by the first lead-in portion 302 and the transmission portion 301.

As shown in FIG. 1, the second power line 40 includes a peripheral portion 401 and two second lead-in portions 402. The peripheral portion 401 surrounds the display area, and the peripheral portion 401 is electrically coupled to a cathode in the display substrate. At least a part of the second lead-in portion 402 extends along the second direction. For example, the second lead-in portion 402 is electrically coupled to a pin bound to a flexible circuit board in the display substrate.

Taking a quadrilateral display substrate as an example, the display area is a quadrilateral, it is defined that a first side of the display area is a side close to the bonding chip, a second side of the display area is a side opposite to the first side, a third side and a fourth side of the display area are opposite, the third side is located on the left side of the display area, and the fourth side is located on the right side of the display area.

The peripheral portion 401 surrounds the second side, third side, fourth side, and part of the first side of the display area, the peripheral portion 401 has an opening on the first side, and the peripheral portion 401 has two ends at the opening, where the two ends are respectively coupled to the two second lead-in portions 402, correspondingly.

The transmission portion 301 is located on the first side of the display substrate, the transmission portion 301 is located between the display area 10 and the peripheral portion 401, and the first lead-in portion 302 is located between the two second lead-in portions 402. In a case that the first power line 30 includes one first lead-in portion 302, each of the second lead-in portions 402 and the one first lead-in portion 302 form a first spacer area 51 and a second spacer area 52. In a case that the first power line 30 includes two first lead-in portions 302, each of the second lead-in portions 402 and the adjacent first lead-in portion 302 form the first spacer area 51 and the second spacer area 52.

Figure 3:
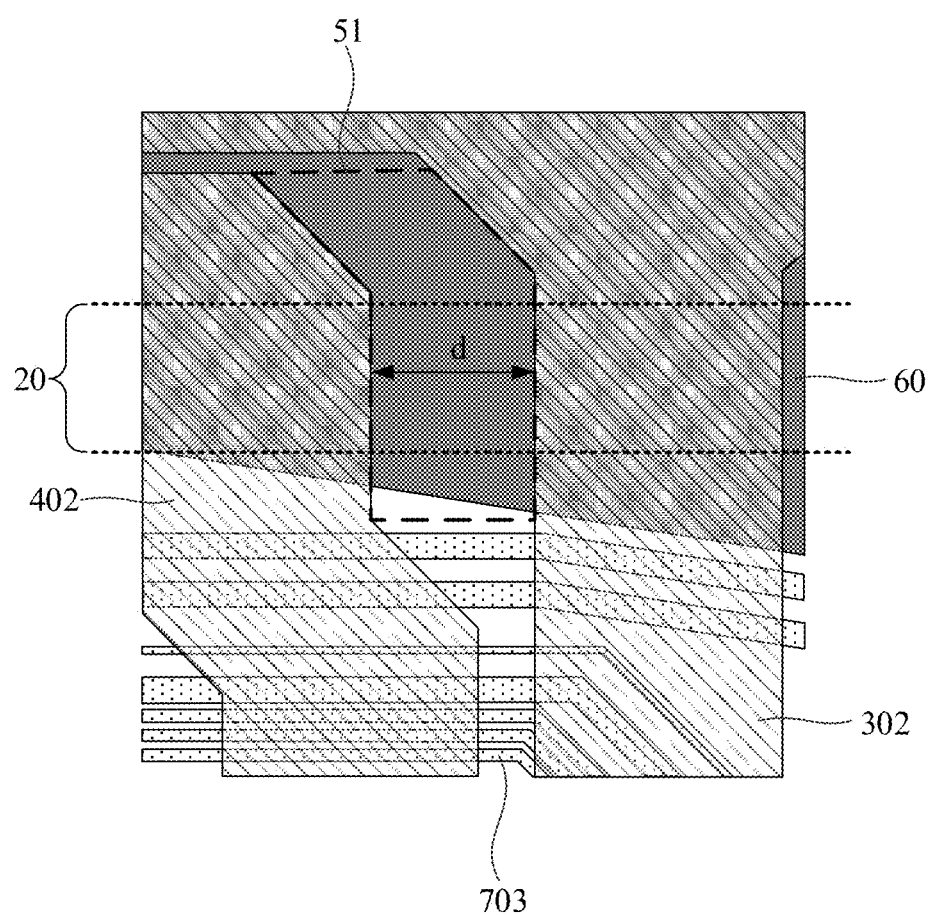
FIG. 3 is a second enlarged schematic diagram of the part A1 in FIG. 1.
Figure 4:
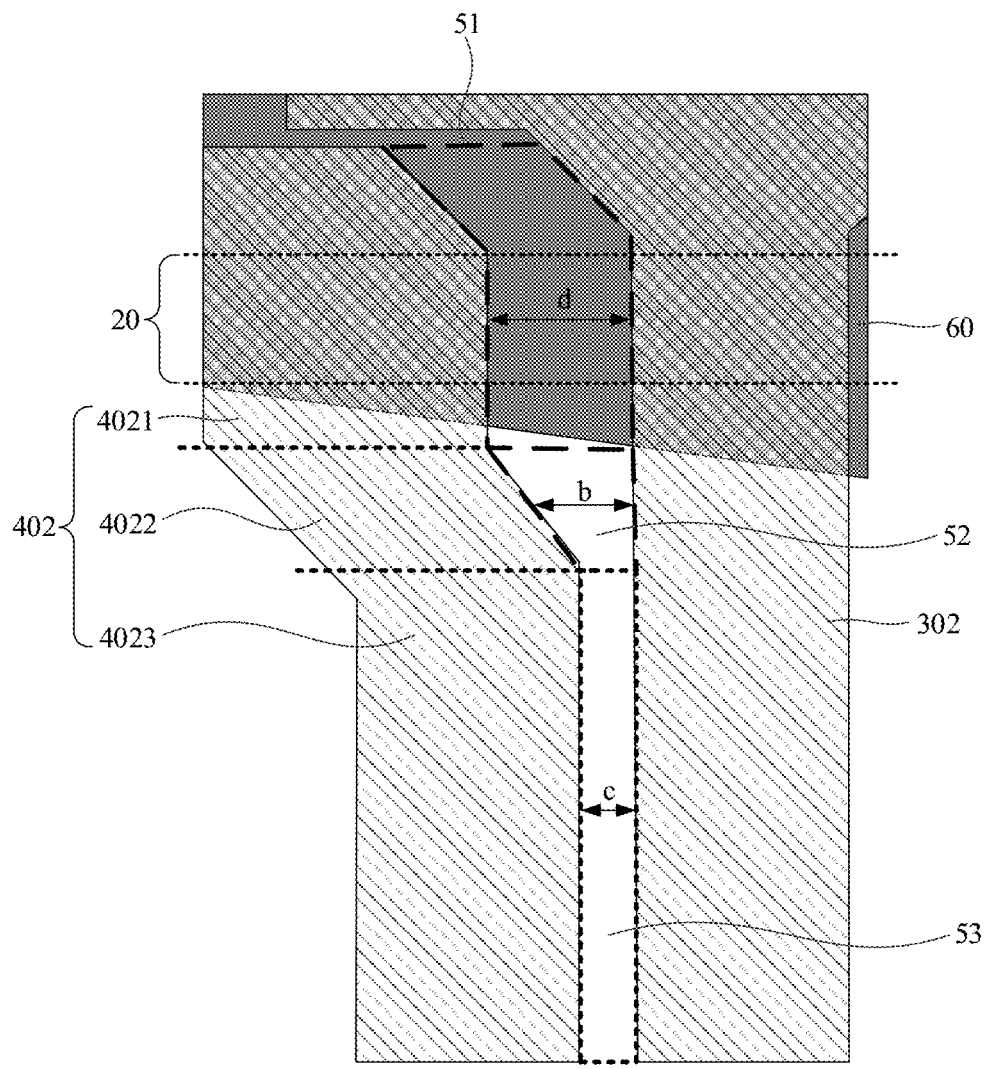
FIG. 4 is a schematic diagram of a spacer area between a first lead-in portion and a second lead-in portion provided by an embodiment of the present disclosure.

As shown in FIG. 1, FIG. 3 and FIG. 4, the non-display area further includes a sealant region 20, and the sealant region 20 surrounds the display area and is used to form Frit glue. The first spacer area 51 and the sealant region 20 have a first overlapping area, and the second spacer area 52 has no overlap with the sealant region 20. At any position of the first spacer area 51, the first spacer area 51 has a first distance or width d in the first direction. For example, the first distance d is the minimum distance of the first spacer area 51 in the first direction. The second spacer area 52 has a second distance b in the first direction. For example, the second distance b is an average distance of the second spacer area 52 in the first direction. Exemplarily, the second distance b is equal to 300 µm. The first distance d is greater than the second distance b.

According to the specific structure of the above-mentioned display substrate, in the display substrate provided by the embodiments of the present disclosure, a first spacer area 51 and a second spacer area 52 are arranged between the second lead-in portion 402 and the first lead-in portion 302, the first spacer area 51 has a first distance d in the first direction, the second spacer area 52 has a second distance b in the first direction, the first spacer area 51 and the sealant region 20 have a first overlapping area, the second spacer area 52 has no overlap with the sealant region 20, and the first distance d is greater than the second distance b, which greatly increase the width between the second lead-in portion 402 and the first lead-in portion 302 in the first overlapping area, and reduces the flatness of a surface of the display substrate in the first overlapping area and facing away from the base substrate, thereby enhancing the bonding area and bonding strength between the Frit glue and the display substrate, and ensuring the effective bonding width of the Frit glue in the first overlapping area when the laser is irradiated for encapsulating. Therefore, the encapsulating effect is improved, and the occurrence of encapsulation failure is prevented. Therefore, in the display substrate provided by the embodiments of the present disclosure, there is no need to add a new film layer or change the existing Frit encapsulation process, and a risk of electrochemical corrosion to the display device can be effectively reduced, which causes by the moisture and oxygen that easily invade the inside of the device from the vicinity of the first overlapping area.

As shown in FIG. 1, FIG. 3, FIG. 15 and FIG. 16, in some embodiments, the non-display area further includes a fan-out area 60, and the fan-out area 60 includes a plurality of fan-out lines 601; the first overlapping area and the fan-out area 60 at least partially overlap.

Specifically, the fan-out area 60 includes the plurality of fan-out lines 601. For example, the display area is provided with a plurality of data lines, and the plurality of fan-out lines 601 includes a plurality of data line leads. The data line leads are electrically coupled to the data lines in a one-to-one correspondence.

Exemplarily, the plurality of fan-out lines are arranged in a same layer and made of a same material.

Exemplarily, the plurality of fan-out lines includes a plurality of first fan-out lines 6011 and a plurality of second fan-out lines 6012, the plurality of first fan-out lines 6011 are arranged in a same layer and made of a same material, the plurality of second fan-out lines 6012 are arranged in a same layer and made of a same material, and the first fan-out line 6011 and the second fan-out line 6012 are arranged in different layers. Orthographic projections of the first fan-out lines 6011 onto the base substrate of the display substrate and orthographic projections of the second fan-out lines 6012 onto the base substrate are alternately arranged.

In the above arrangement that the first overlapping area and the fan-out area 60 at least partially overlaps, the flatness of the surface of the display substrate facing away from the base substrate and in the first overlapping area is further reduced, which further enhances the bonding area and bonding strength between the Frit glue and the display substrate, thereby effectively reducing the narrowing degree of the Frit glue located in the first overlapping area when the laser is irradiated for encapsulating, so as to ensure the effective bonding width of the Frit glue. Therefore, the encapsulating effect is improved, and the occurrence of encapsulation failure is prevented.

In some embodiments, it is designed that the orthographic projection of the first overlapping area onto the base substrate of the display substrate is located inside the orthographic projection of the fan-out area 60 onto the base substrate.

The above arrangement manner minimizes the flatness of the surface of the display substrate facing away from the base substrate and in the first overlapping area, which further enhances the bonding area and bonding strength between the Frit glue and the display substrate, thereby effectively reducing the narrowing degree of the Frit glue located in the first overlapping area when the laser is irradiated for encapsulating, so as to ensure the effective bonding width of the Frit glue. Therefore, the encapsulating effect is improved, and the occurrence of encapsulation failure is prevented.

Figure 15:
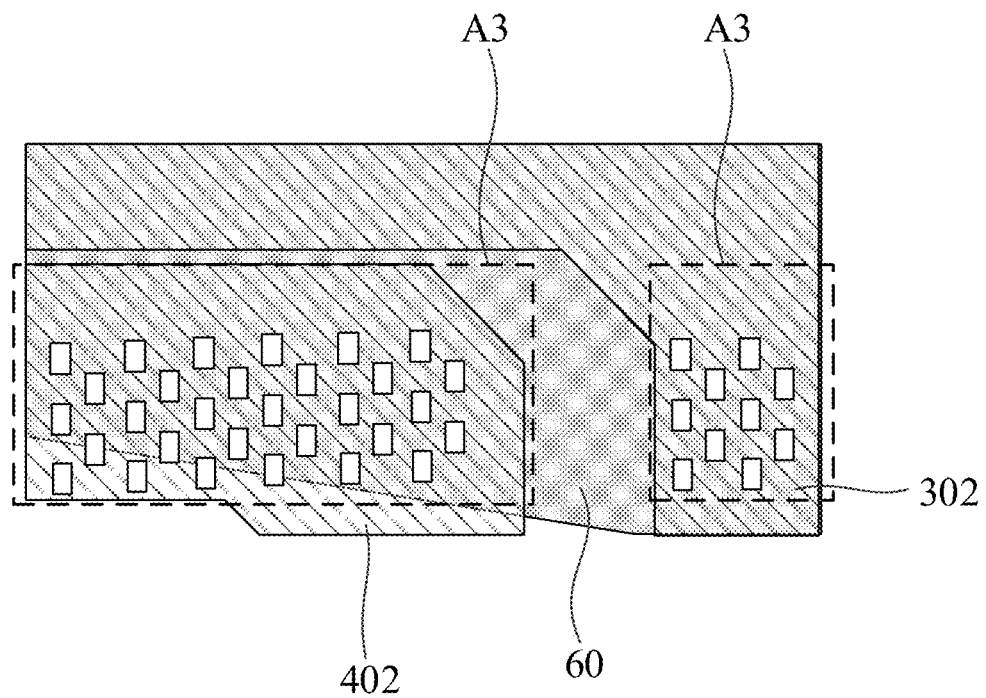
FIG. 15 is a schematic diagram showing overlap of a fan-out area with a first power line and a second power line.
Figure 16:
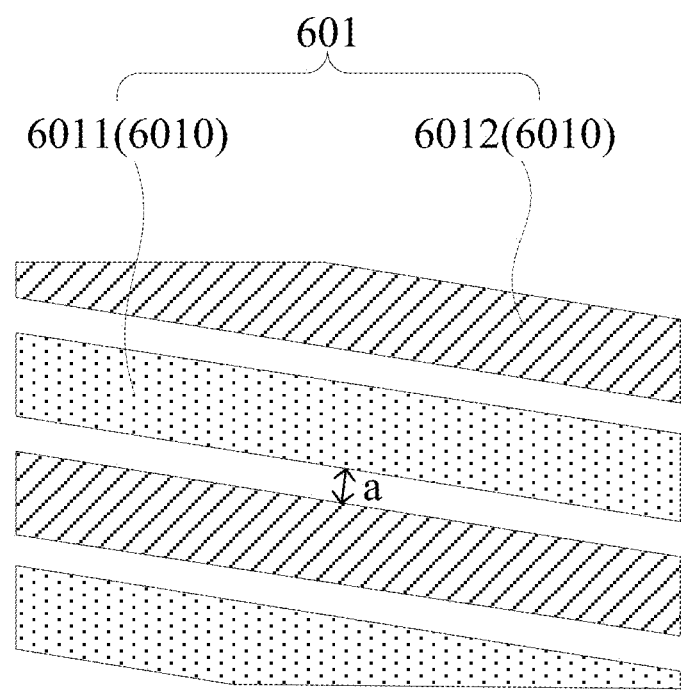
FIG. 16 is an enlarged schematic diagram of the fan-out lines located in area A3 in FIG. 15.

As shown in FIG. 1, FIG. 15 and FIG. 16, in some embodiments, the plurality of fan-out lines 601 includes a plurality of target fan-out lines, and a first portion 6010 of each target fan-out line is located in the sealant region 20. An orthographic projection of the first portion 6010 onto the base substrate overlaps with the orthographic projection of the first power line 30 onto the base substrate, and/or the orthographic projection of the first power line 40 onto the base substrate. A distance between the orthographic projections of the first portions 6010 of any two adjacent target fan-out lines onto the base substrate is larger than 1 µm.

Exemplarily, the multiple fan-out lines 601 are arranged in a same layer and made of a same material.

Exemplarily, the plurality of fan-out lines includes a plurality of first fan-out lines 6011 and a plurality of second fan-out lines 6012, the plurality of first fan-out lines 6011 are arranged in a same layer and made of a same material, the plurality of second fan-out lines 6012 are arranged in a same layer and made of a same material, and the first fan-out line 6011 and the second fan-out line 6012 are arranged in different layers. Orthographic projections of the first fan-out lines 6011 onto the base substrate of the display substrate and orthographic projections of the second fan-out lines 6012 onto the base substrate are alternately arranged.

Exemplarily, the distance between the orthographic projections of the first portions 6010 of any adjacent target fan-out lines onto the base substrate is a=1.5 μm.

Figure 14:
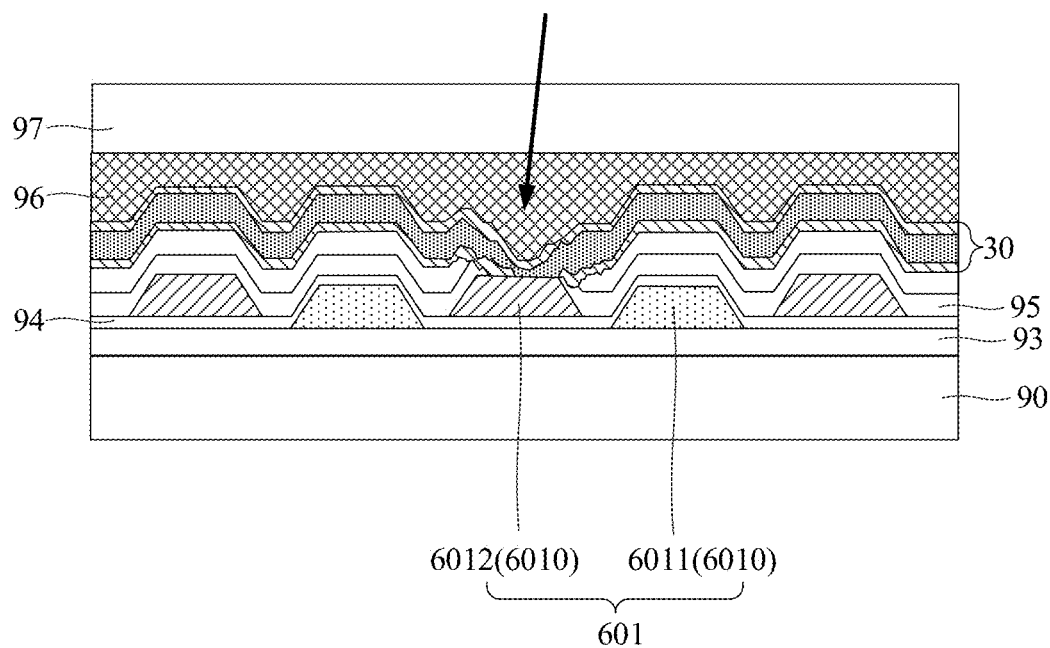
FIG. 14 is a schematic diagram of a short circuit between VDD or VSS and fan-out lines.

As shown in FIG. 14, in a case that frit encapsulation is performed on a rigid OLED display substrate, when the encapsulation cover plate 97 is attached to the display substrate, large particles of foreign matter in the frit glue may easily push or press the first power line 30 and the second power line 40 into the fan-out line 601 (as indicated by the arrow in FIG. 14), which causes the first power line 30 and the second power line 40 to be short-circuited with the fan-out line, resulting in X-line failure.

In the display device provided by the foregoing embodiments, the distance between the orthographic projections of the first portions 6010 of any adjacent target fan-out lines onto the base substrate 90 is larger than 1 μm, so that a line spacing between the first portions 6010 of the adjacent target fan-out lines in the sealant region 20 is increased. Thus, the density of the target fan-out lines covered by the first power line 30 and/or the second power line 40 in the sealant region 20 is reduced. In such a manner, when the encapsulation cover plate 97 is attached to the display substrate, the occurrence probability of the first power line 30 and the second power line 40 being short-circuited with the fan-out line caused by large particles of foreign matter is reduced.

As shown in FIGS. 1, 15 and 16, in some embodiments, the plurality of fan-out lines 601 includes a plurality of target fan-out lines, and the first portion 6010 of each target fan-out line is located in the sealant region 20. An orthographic projection of the first portion 6010 onto the base substrate overlaps with the orthographic projection of the first power line 30 onto the base substrate, and/or the orthographic projection of the first power line 40 onto the base substrate. The distance a between the orthographic projections of the first portions 6010 of any two adjacent target fan-out lines onto the base substrate satisfies the following condition: a=(0.264~0.5)×k, where k is a line width of the target fan-out line.

Specifically, a is 0.264 to 0.5 times of k. Exemplarily, the line width k of the target fan-out line is equal to 3.8 μm.

As shown in FIG. 4, in some embodiments, the second lead-in portion 402 includes a first lead-in sub-pattern 4021, a second lead-in sub-pattern 4022, and a third lead-in sub-pattern 4023 that are electrically coupled in sequence. The first incoming sub-pattern 4021 is electrically coupled to the corresponding end of the peripheral portion 401.

The first spacer area 51 is between the first lead-in sub-pattern 4021 and the first lead-in portion 302.

The second spacer area 52 is between the second incoming sub-pattern 4022 and the first lead-in portion 302; along a direction approaching the first spacer area 51, the second distance b gradually increases, until it is equal to the first distance d.

Exemplarily, a value of the second distance b is between 30 μm and 290 μm, and a value of the first distance d is between 150 μm and 600 μm.

Exemplarily, both the first incoming sub-pattern 4021 and the third incoming sub-pattern 4023 extend along the second direction, and the second incoming sub-pattern 4022 extends along the third direction.

Exemplarily, the first incoming sub-pattern 4021, the second incoming sub-pattern 4022, the third incoming sub-pattern 4023 and the peripheral portion 401 are formed as an integral structure.

The first lead-in sub-pattern 4021 is electrically coupled to the corresponding end of the peripheral portion 401, and the third lead-in sub-pattern 4023 is electrically coupled to the driving chip in the display substrate.

In the above arrangement, along the direction approaching the first spacer area 51, the second distance b gradually increases until it is equal to the first distance d; so that in the direction approaching the sealant region 20, the distance between the second lead-in portion 402 and the first lead-in portion 302 has a gradual increase process, which not only guarantees the encapsulation performance, but also guarantees the stability of signal transmission of the second power line 40.

As shown in FIG. 4, in some embodiments, the third incoming sub-pattern 4023 extends along the second direction, there is a third distance c between the third incoming sub-pattern 4023 and the first incoming portion 302 in the first direction, and the third distance c is equal to the minimum value of the second distance b.

Specifically, the third lead-in sub-pattern 4023 extends along the second direction, the first lead-in portion 302 extends along the second direction, and there is the third distance c between the third incoming sub-pattern 4023 and the first incoming portion 302 in the first direction. Exemplarily, the third distance is equal to 80 μm.

Since the third lead-in sub-pattern 4023 and the first lead-in portion 302 are electrically coupled to the driving chip or the flexible circuit board of the display substrate, and the size of the driving chip or the flexible circuit board is limited, the above configuration that the third distance c is equal to the minimum value of the second distance b enable a relatively short distance between the third lead-in sub-pattern 4023 and the first lead-in portion 302, which is more conducive to reducing the difficulty of electrically connecting the third lead-in sub-pattern 4023 and the first lead-in portion 302 to the driving chip (IC) or the flexible circuit board of the display substrate.

As shown in FIGS. 4 and 19, in some embodiments, a second spacer area 52 is located between the second lead-in sub-pattern 4022 and the first lead-in portion 302; and a third spacer area 53 is located between the third lead-in sub-pattern 4023 and the first lead-in portion 302.

The display substrate further includes a gate drive circuit (GOA), and a plurality of first signal lines 70 used to provide signals to the gate drive circuit (GOA). At least part of the first signal lines 70 is located in the second spacer area 52 and/or the third spacer area 53.

Specifically, the display substrate further includes the GOA. Illustratively, the GOA includes shift register units respectively corresponding to gate lines in the display substrate, which are configured to provide scan signals to the gate lines in the display substrate.

The display substrate further includes a plurality of first signal lines 70 for providing signals to the GOA. The specific types of the first signal lines 70 are various, for example, the first signal lines 70 include a frame start signal line, a clock signal line, a first level signal line, a second level signal line, and the like.

The GOA is located on the left and right sides of the display area, and each of the first signal lines 70 is electrically coupled to the GOA and the driving chip in the display substrate.

Figure 9:
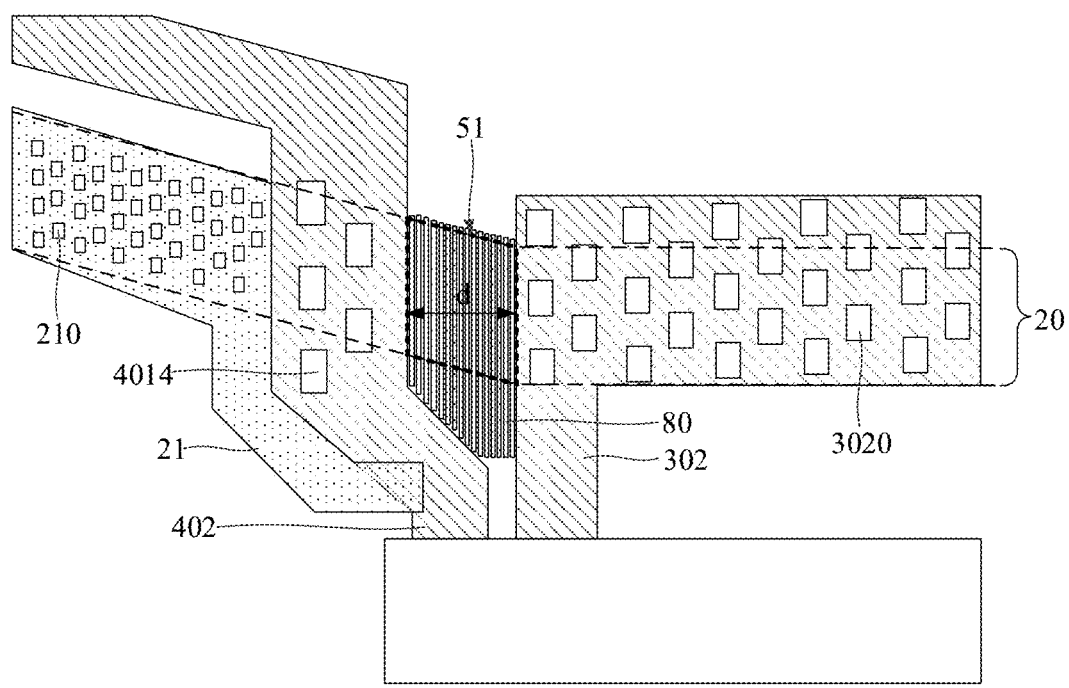
FIG. 9 is a third enlarged schematic diagram of part A3 in FIG. 5.
Figure 10:
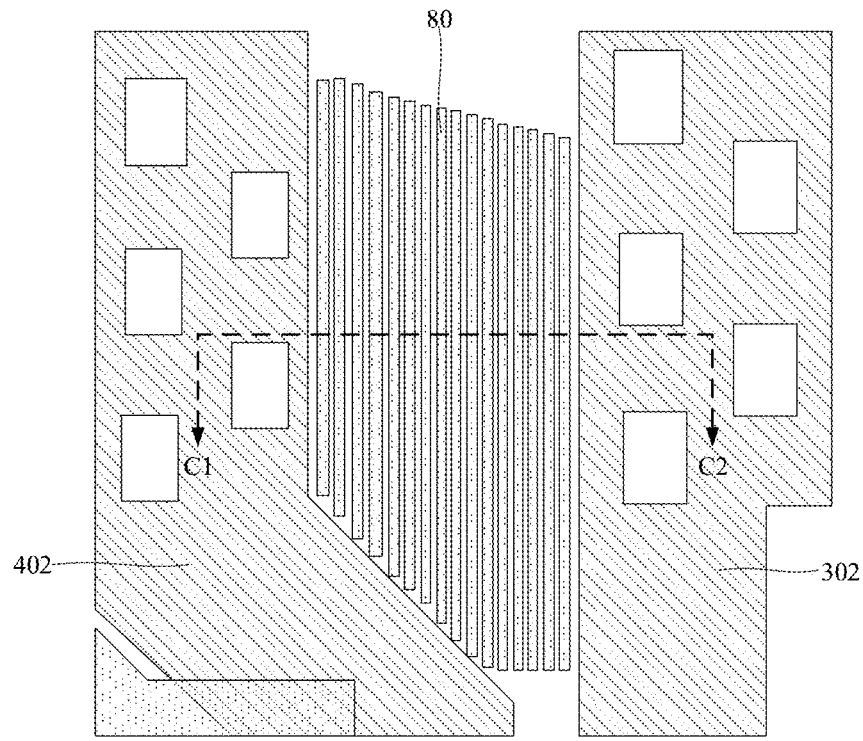
FIG. 10 is an enlarged schematic diagram of the vicinity of a first overlapping area in FIG. 9.

As shown in FIGS. 9 and 10, in some embodiments, the display substrate further includes a plurality of dummy signal lines 80; at least part of each dummy signal line 80 is located in the first overlapping area.

Specifically, the display substrate further includes a plurality of dummy signal lines 80 arranged at intervals. The plurality of dummy signal lines 80 are in a floating state. At least part of each dummy signal line 80 is located in the first overlapping area.

In the above arrangement, at least part of each of the dummy signal lines is arranged in the first overlapping area, so that the surface of the display substrate facing away from the base substrate and in the first overlapping area is uneven, which effectively reduces the unevenness of the surface of the display substrate in the first overlapping area and facing away from the base substrate, thereby enhancing the bonding area and bonding strength between the Frit glue and the display substrate, and effectively reducing the narrowing degree of the Frit glue located in the first overlapping area when the laser is irradiated for encapsulating, so as to ensure the effective bonding width of the Frit glue. Therefore, the encapsulating effect is improved, and the occurrence of encapsulation failure is prevented.

Figure 11:
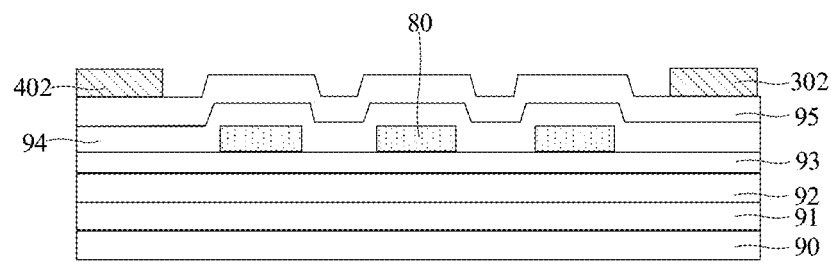
FIG. 11 is a first schematic cross-sectional view taken along a direction of C1 and C2 in FIG. 10.

As shown in FIG. 11, in some embodiments, the display substrate further includes a first gate metal layer, and the dummy signal line 80 and the first gate metal layer are arranged in a same layer and made of a same material.

Specifically, the display substrate includes an active layer, a first gate insulation layer 93, the first gate metal layer, a second gate insulation layer 94, a second gate metal layer, an interlayer insulation layer 95 and a first source-drain metal layer, which are sequentially stacked in a direction away from the base substrate 90. The active layer is used to form active patterns of thin film transistors, some conductive connection patterns in the display substrate, and the like. The first gate metal layer is used to form a gate electrode of the thin film transistor, gate lines in the display substrate, and the like. The second gate metal layer is used to form an electrode plate of a capacitor in the display substrate, an initialization signal line pattern, and the like. The first source-drain metal layer is used to form the first power line 30, the second power line 40, the data line and some conductive connection portions in the display substrate.

The above-mentioned dummy signal line and the first gate metal layer are arranged in the same layer and made of the same material, so that the dummy signal line and the first gate metal layer can be formed in a same patterning process, thereby effectively simplifying the fabricating process of the display substrate, and reducing the production cost.

Figure 12:
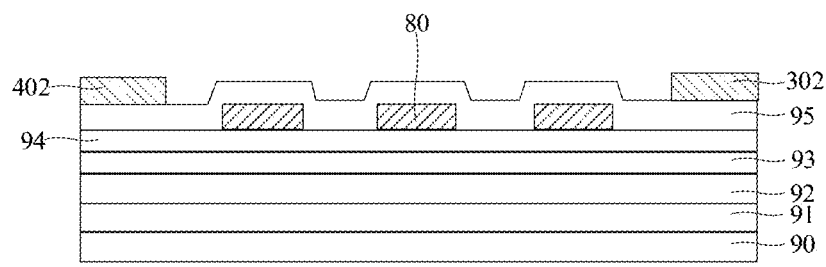
FIG. 12 is a second schematic cross-sectional view taken along the direction of C1 and C2 in FIG. 10.

As shown in FIG. 12, in some embodiments, the display substrate further includes a second gate metal layer, and the dummy signal line 80 and the second gate metal layer are arranged in a same layer and made of a same material.

As mentioned above, the dummy signal line 80 and the second gate metal layer are arranged in the same layer and made of the same material, so that the dummy signal line and the second gate metal layer can be formed in a same patterning process, thereby effectively simplifying the manufacturing process of the display substrate, and reducing the production cost.

Figure 13:
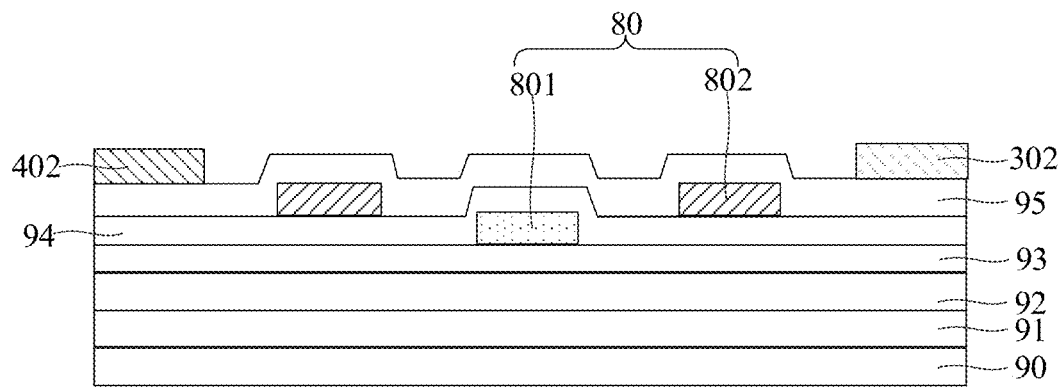
FIG. 13 is a third schematic cross-sectional view taken along the direction of C1 and C2 in FIG. 10.

As shown in FIG. 13, in some embodiments, the display substrate further includes a first gate metal layer and a second gate metal layer; the plurality of dummy signal lines includes a plurality of first dummy signal lines 801 and a plurality of second gate metal layers. An orthographic projection of the first dummy signal line 801 onto the base substrate 90 of the display substrate and an orthographic projection of the second dummy signal line 802 onto the base substrate 90 are alternately arranged and spaced apart. The first dummy signal lines 801 are arranged in a same layer and made of a same material as the first gate metal layer, and the second dummy signal lines 802 are arranged in a same layer and made of a same material as the second gate metal layer.

As described above, the first dummy signal lines 801 and the first gate metal layer are arranged in the same layer and made of the same material, and the second dummy signal lines 802 and the second gate metal layer are arranged in the same layer and made of the same material, so that the first dummy signal lines 801 and the first gate metal layer can be formed in a same patterning process, and the second dummy signal lines 802 and the second gate metal layer can be formed in a same patterning process, thereby effectively simplifying the manufacturing process of the display substrate, and saving the manufacturing cost.

In some embodiments, the dummy signal line 80 extends along the first direction; or, the dummy signal line extends along the second direction.

Specifically, the extension direction of the dummy signal line may be set according to actual requirements. Specifically, the dummy signal line may extend along the first direction, the second direction, or the third direction, and the third direction intersects both the first direction and the second direction.

As shown in FIG. 9, in some embodiments, the dummy signal lines 80 are distributed in the whole first overlapping area.

As described above, the dummy signal lines 80 are distributed in the whole first overlapping area, so that the surface of the display substrate facing away from the base substrate 90 is uneven in the whole first overlapping area, which effectively reduces the flatness of the surface of the display substrate in the first overlapping area and facing away from the base substrate, thereby enhancing the bonding area and bonding strength between the Frit glue and the display substrate, and effectively reducing the narrowing degree of the Frit glue located in the first overlapping area when the laser is irradiated for encapsulating, so as to ensure the effective bonding width of the Frit glue. Therefore, the encapsulating effect is improved, and the occurrence of encapsulation failure is prevented.

Figure 7:
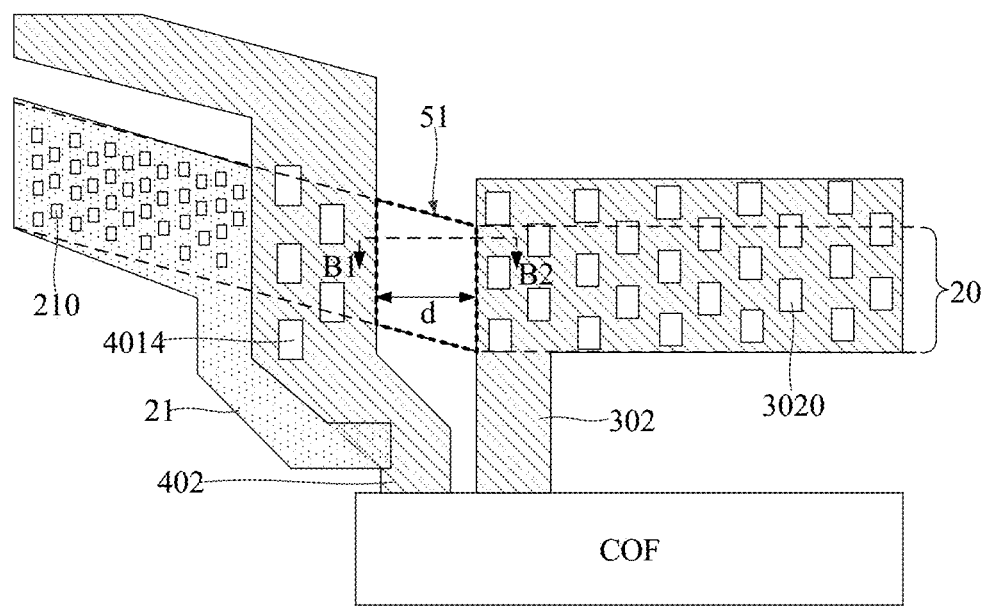
FIG. 7 is a second enlarged schematic diagram of the part A2 in FIG. 5.
Figure 8:
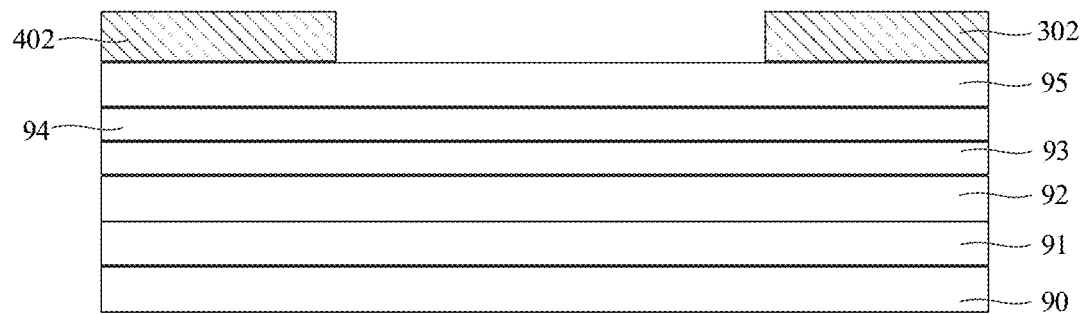
FIG. 8 is a schematic cross-sectional view taken along a direction of B1 and B2 in FIG. 7.

As shown in FIG. 7 and FIG. 19, in some embodiments, the display substrate further includes an encapsulation base layer 21 located in the sealant region 20, and the encapsulation base layer 21 surrounds the display area, and is disconnected at a side of the display area close to the first lead-in portion 302.

In the display substrate provided by the above embodiments, the encapsulation base layer 21 is arranged in the sealant region 20, so that when the Frit glue is laser sintered, the encapsulation base layer 21 can effectively reflect the laser, thereby better speeding up the sintering process.

In some embodiments, the display substrate further includes a first gate metal layer, and the encapsulation base layer 21 and the first gate metal layer are arranged in a same layer and made of a same material.

In the forgoing, the encapsulation base layer 21 and the first gate metal layer are arranged in the same layer and made of the same material, so that the encapsulation base layer 21 and the first gate metal layer can be formed in a same patterning process, thereby effectively simplifying the manufacturing process of the display substrate, and saving the manufacturing cost.

In addition, the metal material used in the first gate metal layer has a better light reflection effect, and the encapsulation base layer 21 and the first gate metal layer are arranged in the same layer and made of the same material, which is more conducive to speeding up the laser sintering process.

As shown in FIG. 7, FIG. 19, FIG. 20 and FIG. 23, in some embodiments, the display substrate further includes a base substrate 90, and a gate insulation layer 93, a second gate insulation layer 94 and an interlayer insulation layer 95, which are sequentially stacked on the base substrate 90 in a direction away from the base substrate 90. The encapsulation base layer 21 is located between the first gate insulation layer 93 and the second gate insulation layer 94.

A plurality of first via holes 210 are provided on the encapsulation base layer 21.

The display substrate is further provided with a plurality of groups of first sub-via holes 220 corresponding to the plurality of first via holes 210 in one-to-one manner, and each group of first sub-via holes 220 includes a plurality of first sub-via holes 220, where orthographic projections of the plurality of first sub-via holes 220 onto the base substrate are located within an orthographic projection of a corresponding first via hole 210 onto the base substrate. Each of the first sub-via holes 220 penetrates the interlayer insulation layer 95, the second gate insulation layer 94 and the first gate insulation layer 93.

Exemplarily, the first via hole 210 and the first sub-via hole 220 are both rectangular holes, the size of the first via hole 210 is 40 μm*40 μm, and the size of the first sub-via hole 220 is 6 μm*6 μm. In each group of first sub-via holes 220, the plurality of first sub-via holes 220 are distributed in an array, and a distance between adjacent first sub-via holes 220 is 3.5 μm.

The display substrate further includes a barrier layer 91 and a buffer layer 92 that are located between the base substrate 90 and the first gate insulation layer 93. Before encapsulation is performed after the display substrate has been manufactured, the first sub-via hole 220 can expose the buffer layer 92, so that when the Frit glue is subsequently formed, the Frit glue can penetrate into the first sub-via holes 220 and contact the buffer layer 92. After laser sintering, the encapsulation cover plate can be firmly bonded or attached to the display substrate together.

Furthermore as described above, the plurality of first via holes 210 and the plurality of groups of first sub-via holes 220 are provided on the encapsulation base layer 21, which effectively enhances the unevenness of a surface of the display substrate in contact with the frame sealant. Thus, the encapsulating effect of the display substrate is effectively improved.

Embodiments of the present disclosure also provide a display device, including the display substrate provided in the above-mentioned embodiments.

Exemplarily, the display device includes a rigid OLED display device.

Exemplarily, the display device includes an encapsulation of a screen of an OLED rigid watch and an encapsulation of a screen of an OLED rigid wristband.

In the display substrate provided by the above-mentioned embodiments, a first spacer area 51 and a second spacer area 52 are arranged between the second lead-in portion 402 and the first lead-in portion 302, the first spacer area 51 has a first distance d in the first direction, the second spacer area 52 has a second distance b in the first direction, the first spacer area 51 and the sealant region 20 have a first overlapping area, the second spacer area 52 has no overlap with the sealant region 20, and the first distance d is greater than the second distance b, which greatly increase the width between the second lead-in portion 402 and the first lead-in portion 302 in the first overlapping area, and reduces the flatness of a surface of the display substrate in the first overlapping area and facing away from the base substrate, thereby enhancing the bonding area and bonding strength between the Frit glue and the display substrate, and ensuring the effective bonding width of the Frit glue in the first overlapping area when the laser is irradiated for encapsulating. Therefore, the encapsulating effect is improved, and the occurrence of encapsulation failure is prevented. Therefore, in the display substrate provided by the embodiments of the present disclosure, there is no need to add a new film layer or change the existing Frit encapsulation process, and a risk of electrochemical corrosion to the display device can be effectively reduced, which causes by the moisture and oxygen that easily invade the inside of the device from the vicinity of the first overlapping area.

The display device provided by the embodiments of the present disclosure including the above-mentioned display substrate also has the above-mentioned beneficial effects, which will not be repeated herein.

It should be noted that the display device may be any product or device with a display function, such as a TV, a monitor, a digital photo frame, a mobile phone, a tablet computer, and so on.

In some embodiments, the display device further includes an encapsulation cover plate 97 disposed opposite to the display substrate, and the encapsulation cover plate 97 and the display substrate are sealed through frame encapsulation glues 96 arranged in the sealant region 20

Embodiments of the present disclosure also provide a method for manufacturing a display substrate, which is used to manufacture the display substrate provided in the above-mentioned embodiments. The display substrate includes a display area and a non-display area surrounding the display area, and the non-display area includes a sealant region 20. The manufacturing method includes: manufacturing a first power line 30 and a second power line 40 in the non-display area.

The first power line 30 includes: a transmission portion 301 and a first lead-in portion 302 coupled to the transmission portion 301, the transmission portion 301 is located between the display area and the first lead-in portion 302, the transmission portion 301 extends in a first direction, at least a part of the first lead-in portion 302 extends in a second direction, and the first direction intersects the second direction.

The second power line 40 includes: a peripheral portion 401 and two second lead-in portions 402; the peripheral portion 401 surrounds the display area, the peripheral portion 401 has an opening, and two ends of the peripheral portion 401 at the opening are coupled to the two second lead-in portions 402, respectively.

The first lead-in portion 302 is located between the two second lead-in portions 402; a first spacer area 51 and a second spacer area 52 are located between each second lead-in portion 402 and the corresponding first lead-in portion 302, the first spacer area 51 has a first distance or width d in the first direction, the second spacer area 52 has a second distance or width b in the first direction, and the first spacer area 51 and the sealant region 20 has a first overlapping area, and the second spacer area 52 does not overlap with the sealant region 20; the first distance d is greater than the second distance b.

In the display substrate manufactured by the manufacturing method provided by the embodiments of the present disclosure, a first spacer area 51 and a second spacer area 52 are arranged between the second lead-in portion 402 and the first lead-in portion 302, the first spacer area 51 has a first distance d in the first direction, the second spacer area 52 has a second distance b in the first direction, the first spacer area 51 and the sealant region 20 have a first overlapping area, the second spacer area 52 has no overlap with the sealant region 20, and the first distance d is greater than the second distance b, which greatly increase the width between the second lead-in portion 402 and the first lead-in portion 302 in the first overlapping area, and reduces the flatness of a surface of the display substrate in the first overlapping area and facing away from the base substrate, thereby enhancing the bonding area and bonding strength between the Frit glue and the display substrate, and ensuring the effective bonding width of the Frit glue in the first overlapping area when the laser is irradiated for encapsulating. Therefore, the encapsulating effect is improved, and the occurrence of encapsulation failure is prevented. Therefore, in the display substrate provided by the embodiments of the present disclosure, there is no need to add a new film layer or change the existing Frit encapsulation process, and a risk of electrochemical corrosion to the display device can be effectively reduced, which causes by the moisture and oxygen that easily invade the inside of the device from the vicinity of the first overlapping area.

It should be noted that various embodiments in this specification are described in a progressive manner, for the same or similar parts between the various embodiments, reference can be referred to each other, and each embodiment focuses on the difference from other embodiments. In particular, for the method embodiment, since it is basically similar to the product embodiment, the description is relatively simple, and the relevant parts can be referred to the part of the description of the product embodiment.

Unless otherwise defined, technical terms or scientific terms used in the present disclosure shall have usual meanings understood by those of ordinary skills in the field to which this disclosure belongs. Similar words such as "first" and "second" used in the present disclosure do not indicate any order, quantity or importance, but are only used to distinguish different components. Similar words such as "include" and "comprise" mean that an element or item appearing before the word covers elements or items listed after the word and their equivalents, but does not exclude other elements or items. Similar words such as "coupled", "coupled" and "intercoupled" are not limited to physical or mechanical connections, but may include electrical connections, whether direct or indirect connection. Terms such as "up", "down", "left" and "right" are only used to indicate a relative position relationship, and when an absolute position of the described object changes, the relative position relationship may also change accordingly.

It may be appreciated that when an element such as a layer, film, region or substrate is referred to as being "on" or "under" another element, the element may be "directly" "on" or "under" the other element, or there may be an intermediate element.

In the description of the foregoing embodiments, specific features, structures, materials, or characteristics may be combined in any one or more embodiments or examples in a suitable manner.

The foregoing embodiments are only specific implementations of the present disclosure, but the protection scope of the present disclosure is not limited thereto. Any person skilled in the art can easily think of changes or substitutions within the technical scope disclosed in the present disclosure, all of which shall fall within the protection scope of the present disclosure. Therefore, the protection scope of the present disclosure should be subject to the protection scope of the claims.

What is claimed is:

1. A display substrate, comprising a display area and a non-display area surrounding the display area, wherein:
    the non-display area comprises a sealant region surrounding the display area; the sealant region comprises: a corner sealant region and a first sealant region that are on a first side of the display area; the corner sealant region is provided with an encapsulation base layer; the non-display area is provided with a second power line and a plurality of first signal lines;
    the second power line comprises a first power line portion, the first power line portion overlaps the first sealant region, and the first power line portion extends in a first direction;
    at least a portion of the plurality of first signal lines is located in the corner sealant region, and in the corner sealant region, the plurality of first signal lines extends in a second direction and the plurality of first signal lines are arranged at intervals in the first direction; the first direction intersects the second direction; an orthographic projection of the plurality of first signal lines located in the corner sealant region onto a base substrate of the display substrate is located between an orthographic projection of the encapsulation base layer onto the base substrate and an orthographic projection of the first power line portion onto the base substrate; and
    the encapsulation base layer and the first power line portion are respectively provided with a plurality of via holes.

2. The display substrate according to claim 1, wherein the second power line further comprises a power line corner portion, wherein a boundary of the power line corner portion away from the display area has a shape of an arc, the power line corner portion has a corner width along a curvature radius direction of the arc, and the corner width gradually becomes smaller along a direction of the first sealant region pointing to the corner sealant region.

3. The display substrate according to claim 2, wherein in the second direction, a width of the first power line portion is greater than a maximum value of the corner width.

4. The display substrate according to claim 1, wherein the orthographic projection of the encapsulation base layer onto the base substrate and an orthographic projection of the power line corner portion onto the base substrate are at least partially overlapped.

5. The display substrate according to claim 1, wherein the non-display area is further provided with a gate drive circuit, wherein the gate drive circuit is provided with a signal by the plurality of first signal lines, at least part of the gate drive circuit is located between the display area and the corner sealant region, and the orthographic projection of the target portion onto the base substrate of the display substrate and an orthographic projection of the power line corner portion onto the base substrate are at least partially overlapped.

6. The display substrate according to claim 5, wherein the non-display area is further provided with a driving chip; each of the first signal lines further comprises a first non-target portion and a second non-target portion, and the first non-target portion is coupled to the target portion and the second non-target portion;
    the first non-target portion is located on a side of the first power line portion facing away from the display area, at least part of the first non-target portion extends along the first direction, and the first non-target portion and the first power line portion are arranged in a same layer and made of a same material; and the second non-target portion is coupled to the driving chip, and the second non-target portion and the first non-target portion are arranged in different layers.

7. The display substrate according to claim 6, wherein both the second non-target portion and the target portion are arranged in a same layer and made of a same material as the encapsulation base layer.

8. The display substrate according to claim 6, further comprising a first gate metal layer, wherein the encapsulation base layer and the first gate metal layer are arranged in a same layer and made of a same material.

9. The display substrate according to claim 6, further comprising a first gate metal layer and a second gate metal layer, wherein among the plurality of first signal lines, first target portions comprised in some of the first signal lines are arranged in a same layer and made of a same material as the first gate metal layer, and second target portions comprised in some other of the first signal lines are arranged in a same layer and made of a same material as the second gate metal layer; and
wherein orthographic projections of the first target portions onto the base substrate of the display substrate and orthographic projections of the second target portions onto the base substrate are alternately arranged and spaced apart.

10. The display substrate according to claim 1, wherein the sealant region further comprises a second sealant region, the second sealant region surrounds other sides of the display area except the first side, and the encapsulation base layer extends to cover the second sealant region.

11. The display substrate according to claim 10, wherein:
the display substrate further comprises the base substrate, a first gate insulation layer, a second gate insulation layer and an interlayer insulation layer that are sequentially stacked on the base substrate in a direction away from the base substrate, and the encapsulation base layer is located between the first gate insulation layer and the second gate insulation layer;
a plurality of first via holes are provided on the encapsulation base layer; and
the display substrate is further provided with a plurality of groups of first sub-via holes corresponding to the plurality of first via holes in one-to-one manner, and each group of first sub-via holes comprises a plurality of first sub-via holes, wherein orthographic projections of the plurality of first sub-via holes onto the base substrate are located within an orthographic projection of a corresponding one of the first via holes onto the base substrate, and each of the first sub-via holes penetrates the interlayer insulation layer, the second gate insulation layer and the first gate insulation layer.

12. The display substrate according to claim 10, wherein the second power line further comprises a second power line portion, the second power line portion is electrically coupled to the power line corner portion, and the second power line portion surrounds the other sides of the display area except the first side; and
an orthographic projection of the second power line portion onto the base substrate overlaps the orthographic projection of the encapsulation base layer onto the base substrate, and the second power line portion and the encapsulation base layer are electrically coupled at an overlapping position.

13. The display substrate according to claim 12, wherein the encapsulation base layer located in the second sealant region comprises a main body portion and a plurality of conductive connection portions, and the main body portion surrounds the other sides of the display area except the first side;
the plurality of conductive connection portions is electrically coupled to the main body portion, and the plurality of conductive connection portions is arranged at intervals along an extending direction of the main body portion; and
an orthographic projection of each of the conductive connection portions onto the base substrate of the display substrate overlaps an orthographic projection of the second power line portion onto the base substrate, and the second power line portion is electrically coupled to the conductive connection portions at respective overlapping positions.

14. The display substrate according to claim 13, wherein the main body portion and the plurality of conductive connection portions are formed as an integral structure.

15. The display substrate according to claim 1, wherein a plurality of second via holes are provided on the first power line portion.

16. The display substrate according to claim 1, wherein the sealant region further comprises a lead-in sealant region that is on the first side of the display area, wherein the lead-in sealant region is located on a side of the first sealant region away from the corner sealant region;
or,
wherein the non-display area is further provided with a first power line, and the first power line comprises: a transmission portion and two first lead-in portions coupled to the transmission portion;
the transmission portion is located between the display area and the first power line portion, and the transmission portion extends along the first direction; and
the two first lead-in portions are located on a side of the transmission portion facing away from the display area, the first lead-in portions extend along the second direction, and at least a part of the first lead-in portions is located in the lead-in sealant region.

17. The display substrate according to claim 16, wherein a plurality of third via holes are provided on the part of the first lead-in portions located in the lead-in sealant region.

18. A display device, comprising the display substrate according to claim 1.

19. The display device according to claim 18, further comprising an encapsulation cover plate arranged opposite to the display substrate, wherein the encapsulation cover plate and the display substrate are sealed through frame encapsulation glues arranged in the sealant region.

20. A method for manufacturing a display substrate, wherein the display substrate comprises a display area and a non-display area surrounding the display area, and the non-display area comprises a sealant region surrounding the display area; the sealant region comprises: a corner sealant region and a first sealant region that are on a first side of the display area; and the manufacturing method comprises:
manufacturing an encapsulation base layer in the corner sealant region; and
manufacturing, in the non-display area, a second power line and a plurality of first signal lines,
wherein the second power line comprises a first power line portion, the first power line portion overlaps the first sealant region, and the first power line portion extends in a first direction;
at least a portion of the plurality of first signal lines is located in the corner sealant region, and in the corner sealant region, the plurality of first signal lines extends in a second direction and the plurality of first signal lines are arranged at intervals in the first direction; the first direction intersects the second direction; an orthographic projection of the plurality of first signal lines located in the corner sealant region onto a base substrate of the display substrate is located between an orthographic projection of the encapsulation base layer onto the base substrate and an orthographic projection of the first power line portion onto the base substrate; the encapsulation base layer and the first power line portion are respectively provided with a plurality of via holes.

\* \* \* \* \*